United States Patent
Miyoshi

(10) Patent No.: US 9,440,259 B2
(45) Date of Patent: Sep. 13, 2016

(54) ELECTROACOUSTIC CONVERSION FILM, ELECTROACOUSTIC CONVERTER, FLEXIBLE DISPLAY, AND PROJECTOR SCREEN

(71) Applicant: FUJIFILM Corporation, Tokyo (JP)

(72) Inventor: Tetsu Miyoshi, Ashigara-kami-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/860,944

(22) Filed: Sep. 22, 2015

(65) Prior Publication Data

US 2016/0008852 A1    Jan. 14, 2016

Related U.S. Application Data

(63) Continuation of application No. PCT/JP2014/058567, filed on Mar. 26, 2014.

(30) Foreign Application Priority Data

Mar. 28, 2013  (JP) .................................. 2013-068354
Oct. 21, 2013  (JP) .................................. 2013-218401

(51) Int. Cl.
*B06B 1/06* (2006.01)
*H04R 17/00* (2006.01)
(Continued)

(52) U.S. Cl.
CPC ........... *B06B 1/0662* (2013.01); *B06B 1/0688* (2013.01); *G03B 21/56* (2013.01); *H01L 41/047* (2013.01); *H01L 41/0475* (2013.01); *H01L 41/0973* (2013.01); *H01L 41/183* (2013.01);
(Continued)

(58) Field of Classification Search
CPC .. G03B 121/56; G03B 21/565; G03B 21/56; H04R 17/00; H04R 17/005
See application file for complete search history.

(56) References Cited

U.S. PATENT DOCUMENTS 3,798,473 A * 3/1974 Murayama ............ B06B 1/0677
                                                      310/334
5,400,414 A * 3/1995 Thiele ..................... G03B 21/56
                                                      348/E5.13
(Continued)

FOREIGN PATENT DOCUMENTS

GB    2219712 A * 12/1989 ............. H04R 17/00
JP    55-114099 A    9/1980
(Continued)

OTHER PUBLICATIONS

International Search Report, issued in PCT/JP2014/058567, dated May 13, 2014.
(Continued)

*Primary Examiner* — Christ Mahoney
(74) *Attorney, Agent, or Firm* — Birch, Stewart, Kolasch & Birch, LLP

(57) ABSTRACT

The present invention provides an electroacoustic conversion film comprising: a polymeric composite piezoelectric body in which piezoelectric body particles are dispersed in a viscoelastic matrix formed of a polymer material exhibiting viscoelasticity at normal temperature; and two or more electrode pairs, wherein one electrode and the other electrode of each of the electrode pairs are arranged on two opposite main surfaces of the polymeric composite piezoelectric body, respectively, to interpose the polymeric composite piezoelectric body therebetween, and thereby each of the electrode pairs forms an active region.

24 Claims, 18 Drawing Sheets

(51) Int. Cl.

| | |
|---|---|
| *H01L 41/047* | (2006.01) |
| *H04R 7/04* | (2006.01) |
| *H01L 41/37* | (2013.01) |
| *H01L 41/09* | (2006.01) |
| *H01L 41/18* | (2006.01) |
| *G03B 21/56* | (2006.01) |
| *H04R 17/02* | (2006.01) |
| *H01L 41/257* | (2013.01) |
| *H04R 5/02* | (2006.01) |
| *G10K 11/178* | (2006.01) |

(52) U.S. Cl.
CPC .............. *H01L 41/37* (2013.01); *H04R 7/04* (2013.01); *H04R 17/005* (2013.01); *H04R 17/025* (2013.01); *G10K 11/1788* (2013.01); *G10K 2210/3229* (2013.01); *H01L 41/257* (2013.01); *H04R 5/02* (2013.01); *H04R 2217/03* (2013.01); *H04R 2307/025* (2013.01); *H04R 2499/15* (2013.01)

(56) References Cited

U.S. PATENT DOCUMENTS

| | | | |
|---|---|---|---|
| D731,460 S * | 6/2015 | Miyoshi | ............ D14/204 |
| 2005/0100181 A1 | 5/2005 | Croft, III et al. | |
| 2009/0110217 A1 | 4/2009 | Yasuda et al. | |
| 2011/0128245 A1 | 6/2011 | Andoh et al. | |
| 2013/0256581 A1 | 10/2013 | Miyoshi et al. | |
| 2014/0210309 A1 | 7/2014 | Miyoshi | |

FOREIGN PATENT DOCUMENTS

| | | |
|---|---|---|
| JP | 62-231591 A | 10/1987 |
| JP | 63-12994 U | 1/1988 |
| JP | 2001-326997 A | 11/2001 |
| JP | 2002-27582 A | 1/2002 |
| JP | 2003-244791 A | 8/2003 |
| JP | 2006-339954 A | 12/2006 |
| JP | 2007-503742 A | 2/2007 |
| JP | 2007-287910 A | 11/2007 |
| JP | 2008-294493 A | 12/2008 |
| JP | 2009-278496 A | 11/2009 |
| JP | 2012-90294 A | 5/2012 |
| JP | 2012-95193 A | 5/2012 |
| JP | 2012-142546 A | 7/2012 |
| JP | 2012-184441 A | 9/2012 |
| WO | WO 2009/144964 A1 | 12/2009 |
| WO | WO 2013/047875 A1 | 4/2013 |

OTHER PUBLICATIONS

International Preliminary Report, issued in PCT/JP2014/058567, dated Sep. 29, 2015.

Japanese Office Action, dated Jan. 26, 2016, for Japanese Application No. 2014-063914, including an English machine translation.

* cited by examiner

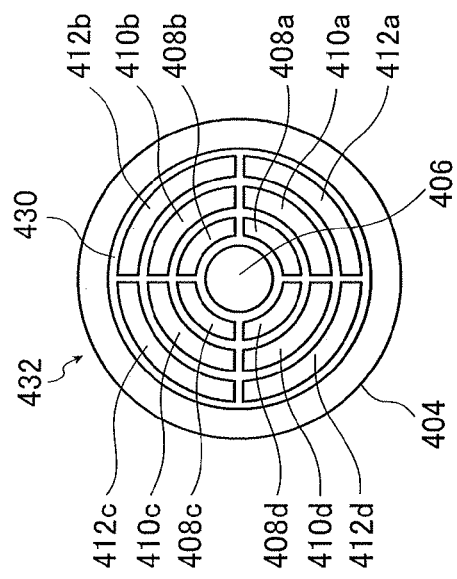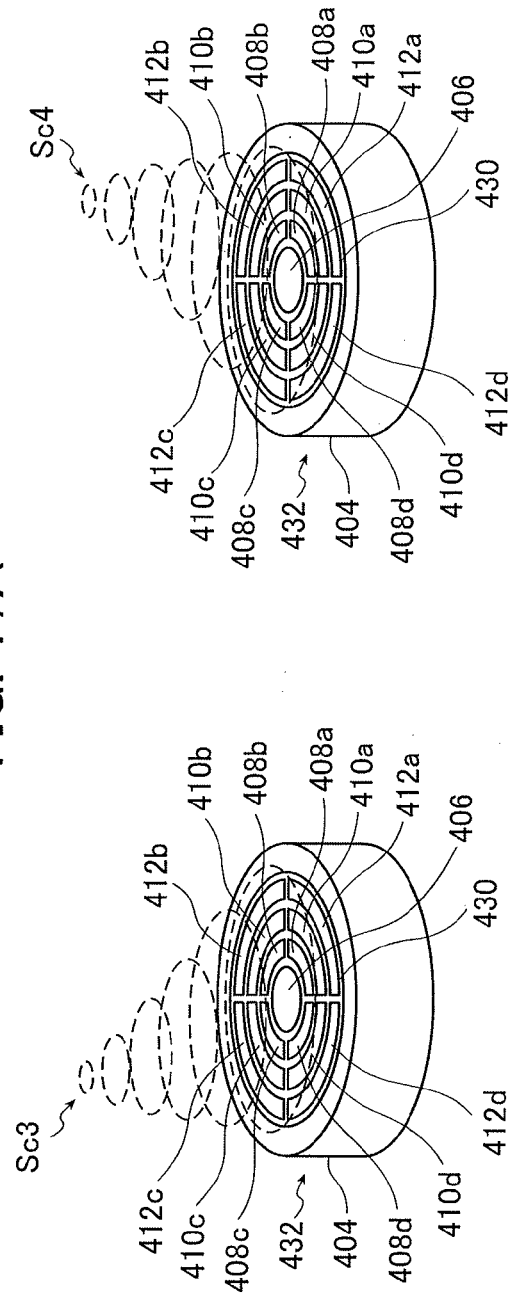

ELECTROACOUSTIC CONVERSION FILM, ELECTROACOUSTIC CONVERTER, FLEXIBLE DISPLAY, AND PROJECTOR SCREEN

CROSS-REFERENCE TO RELATED APPLICATIONS

This application is a Continuation of PCT International Application No. PCT/JP2014/058567 filed on Mar. 26, 2014, which claims priority under 35 U.S.C. §119(a) to Japanese Patent Application No. 2013-068354 filed on Mar. 28, 2013 and Japanese Patent Application No. 2013-218401 filed on Oct. 21, 2013. Each of the above application(s) is hereby expressly incorporated by reference, in its entirety, into the present application.

BACKGROUND OF THE INVENTION

The present invention relates to an electroacoustic conversion film used for an acoustic device such as a speaker, and to an electroacoustic converter, a flexible display, and a projector screen using the electroacoustic conversion film.

In a flexible display using a flexible substrate (for example, plastics) such as an organic EL display, it has been considered that a flexible piezoelectric film having a sheet shape is adopted as a speaker that can be integrated with a flexible display without impairing the lightweightness or flexibility.

For example, JP 2008-294493 A discloses a piezoelectric film in which an electrode layer is formed on each of both surfaces of a piezoelectric body layer made of a uniaxially stretched polyvinylidene fluoride (PVDF) film on which polarization processing has been performed at a high voltage.

Further, JP 2003-244791 A discloses that a composite piezoelectric sheet, which is obtained by molding a polymer sheet such as PVDF or an epoxy resin in which a large number of piezoelectric elements (piezoelectric ceramics) are mixed, is used as a piezoelectric film.

In a configuration in which such a piezoelectric film is used as a vibration plate, since the vibration plate having a single plane is used, there is a problem in that it is difficult to output a broad band, such as, for example, the entire audible range (20 Hz to 20 kHz), at a uniform sound pressure level.

Therefore, JP 2003-244791 A describes that it is possible to broaden a band by dividing a vibration plate composed of the piezoelectric film and a pair of electrodes into a plurality of regions and forming a curved portion in which the respective regions have curvatures different from each other.

SUMMARY OF THE INVENTION

However, as described in JP 2003-244791 A, if the vibration plate is divided into a plurality of regions, and the curved portion is formed using the respective regions, there is a problem in that it is difficult for the vibration plate to be integrated with a flexible display. Further, when the vibration plate is integrated with a thin display, it is necessary for the display to be thick according to the height of the curved portion, and accordingly, there is also a problem in that a characteristic that the display is thin is impaired. Moreover, there is the other problem in that, if an area of a speaker increases, the thickness thereof increases even if the curvature thereof is gentle, and a characteristic as a thin speaker is impaired.

Further, both of the speakers described in JP 2008-294493 A and JP 2003-244791 A are those which reproduce one audio signal. Reproduction of a plurality of different audio signals from one vibration plate, for example, stereo reproduction or surround reproduction, is not considered in these speakers.

The present invention has been made to solve the above-described problems in the conventional art, and an object of the present invention is to provide an electroacoustic conversion film capable of reproducing a plurality of different audio signals from one vibration plate without causing the audio signals to interfere with each other, capable of broadening a frequency band to be reproduced, and capable of being integrated with a flexible display in a thin shape.

In order to achieve the above object, the present invention provides an electroacoustic conversion film comprising: a polymeric composite piezoelectric body in which piezoelectric body particles are dispersed in a viscoelastic matrix formed of a polymer material exhibiting viscoelasticity at normal temperature; and two or more electrode pairs, wherein one electrode and the other electrode of each of the electrode pairs are arranged on two opposite main surfaces of the polymeric composite piezoelectric body, respectively, to interpose the polymeric composite piezoelectric body therebetween, and thereby each of the electrode pairs forms an active region.

In the electroacoustic conversion film of the present invention, preferably, a plurality of electrodes, which are arranged on one main surface side of the polymeric composite piezoelectric body, of the electrode pairs is a common electrode.

Preferably, all electrodes, which are arranged on one main surface side of the polymeric composite piezoelectric body, of the electrode pairs are a common electrode.

Preferably, two active regions of a first active region and a second active region are formed by two electrode pairs of the two or more electrode pairs, and a signal of an R channel for stereo is input to the first active region, and a signal of an L channel for stereo is input to the second active region.

Preferably, three active regions of a first active region, a second active region and a third active region are formed by three electrode pairs of the two or more electrode pairs, and a signal of an R channel for stereo is input to the first active region, a signal of an L channel for stereo is input to the second active region, and a bass signal is input to the third active region.

Preferably, a longitudinal direction of the third active region matches a longitudinal direction of the polymeric composite piezoelectric body, and a width in the longitudinal direction of the third active region is approximately the same as a width in the longitudinal direction of the polymeric composite piezoelectric body.

Preferably, each interspace between two or more active regions is 1 mm or more.

Preferably, a dummy electrode is arranged on a main surface of the polymeric composite piezoelectric body in the interspace between two or more active regions.

Preferably, a storage elastic modulus (E') at a frequency of 1 Hz, of the electroacoustic conversion film, that is obtained by the dynamic viscoelasticity measurement, is 10 GPa to 30 GPa at 0° C. and 1 GPa to 10 GPa at 50° C.

Preferably, a glass transition temperature of the polymer material at a frequency of 1 Hz is 0° C. to 50° C.

Preferably, the maximum value of the loss tangent (Tan δ) at a frequency of 1 Hz of the polymer material, that is 0.5 or higher and is obtained by dynamic viscoelasticity measurement, is present in a temperature range of 0° C. to 50° C.

Preferably, the polymer material is at least one of cyanoethylated polyvinyl alcohol, polyvinyl acetate, polyvinylidene chloride co-acrylonitrile, polystyrene-vinyl polyisoprene block copolymer, polyvinyl methyl ketone, and polybutyl methacrylate.

Preferably, the two or more electrode pairs are concentrically arranged.

Preferably, a signal to which a temporal delay is given according to a position of each of the two or more electrode pairs is input to each of the two or more electrode pairs.

In addition, the present invention provides an electroacoustic converter comprising: the electroacoustic conversion film described above; an elastic support arranged in close contact with one main surface of the electroacoustic conversion film; and a holding member that presses the electroacoustic conversion film against the viscoelastic support to hold the electroacoustic conversion film, wherein a signal to which a temporal delay is given according to a position of each of two or more electrode pairs is input to each of the two or more electrode pairs of the electroacoustic conversion film.

Preferably, the elastic support have viscoelasticity.

Further, the present invention provides a flexible display, wherein the electroacoustic conversion film described above is attached to a surface at the side opposite to an image display surface of a flexible display having flexibility.

Additionally, the present invention provides a projector screen comprising: a screen that displays an image projected by a projector thereon; and the electroacoustic conversion film described above, wherein the electroacoustic conversion film is attached to a surface at the side opposite to an image display surface of the screen.

Preferably, at least one of active regions formed by the electrode pairs is used as a microphone.

Furthermore, the present invention provides a noise cancelling system comprising: the electroacoustic conversion film described above.

According to the electroacoustic conversion film of the present invention configured as above, it is possible to reproduce a plurality of different audio signals from one vibration plate without causing the audio signals to interfere with each other, and to perform stereo reproduction or surround reproduction. Furthermore, it is possible to reproduce an audio signal with high sound quality in a broad frequency band. Moreover, the electroacoustic conversion film of the present invention can be integrated with a flexible display in a thin shape.

BRIEF DESCRIPTION OF THE DRAWINGS

FIG. 17A is a view conceptually illustrating an example of a speaker using another example of the electroacoustic conversion film of the present invention, FIG. 17B is a conceptual view explaining an example of an operation of the speaker in FIG. 17A, and FIG. 17C is a conceptual view explaining another example of the operation of the speaker in FIG. 17A.

DETAILED DESCRIPTION OF THE INVENTION

Hereinafter, an electroacoustic conversion film, an electroacoustic converter, a flexible display, and a projector screen of the present invention will be described in detail based on preferred embodiments illustrated in the accompanying drawings.

Figure 1:
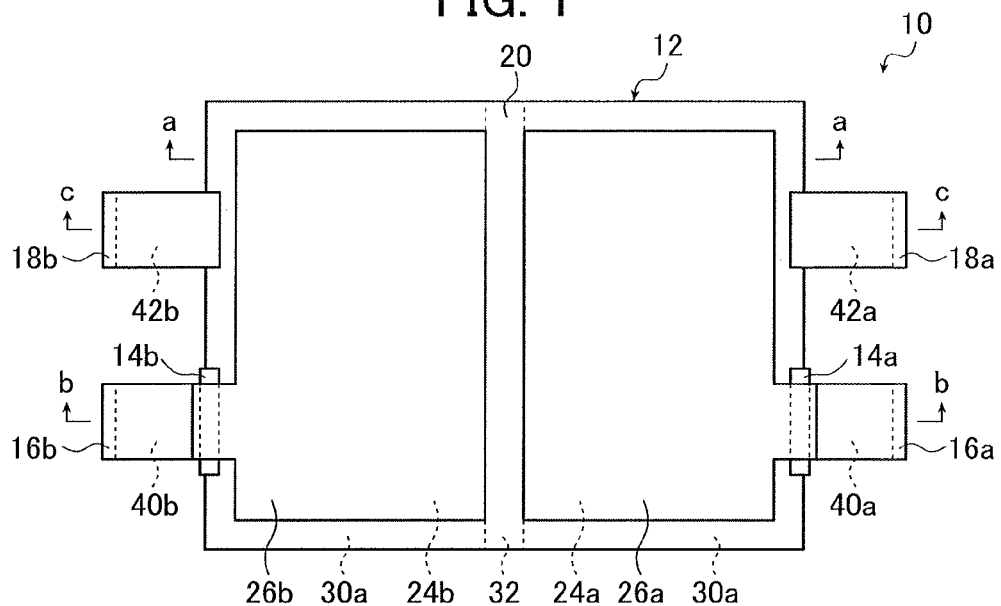
FIG. 1 is a view conceptually illustrating an example of an electroacoustic conversion film of the present invention.

FIG. 1 conceptually illustrates an example of an electroacoustic conversion film (hereinafter referred to as a conversion film) of the present invention.

The (electroacoustic) conversion film 10 illustrated in FIG. 1 is basically configured with a piezoelectric laminate 12, insulating sheets 14a and 14b, lead-out metal foils for upper electrode 16a and 16b, and lead-out metal foils for lower electrode 18a and 18b.

The conversion film 10 is used in speakers, microphones, and various acoustic devices (electroacoustic converters) such as a pickup used for musical instruments including a guitar, for generating (reproducing) sound caused by vibration occurring in response to electric signals, and for converting the vibration caused by sound into electric signals.

Figure 2A:
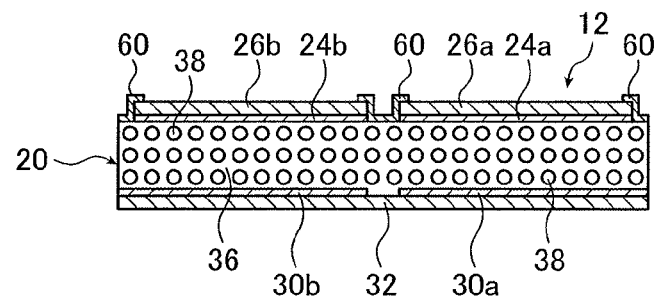
FIGS. 2A, 2B, and 2C are views conceptually illustrating cross sections taken along lines a-a, b-b, and c-c in FIG. 1, respectively.
Figure 2B:
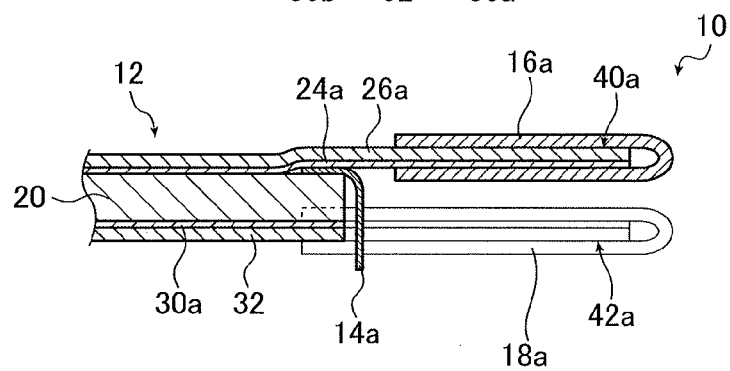
Figure 2C:
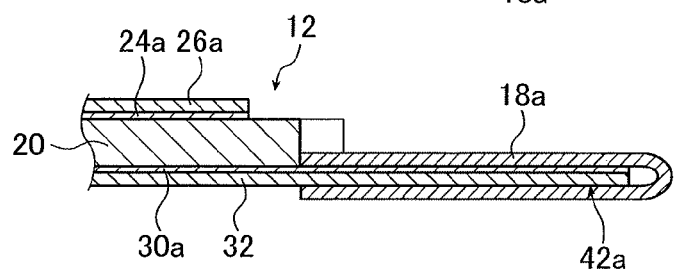

In the conversion film 10, the piezoelectric laminate 12 is configured with a piezoelectric body layer 20 that is a sheet-like material having piezoelectric properties, two upper thin film electrodes 24a and 24b formed on one surface (an upper surface in the illustrated example) of the piezoelectric body layer 20, two upper protective layers 26a and 26b formed on the upper thin film electrodes 24a and 24b respectively, lower thin film electrodes 30a and 30b formed on a surface opposite to the upper electrodes 24a and 24b of the piezoelectric body layer 20, and a lower protective layer 32 formed on the lower thin film electrode 30 (a lower surface in FIGS. 2A to 2C).

As conceptually illustrated in FIG. 2A, the piezoelectric body layer 20 in the conversion film 10 of the present invention is formed of the polymeric composite piezoelectric body that is obtained by uniformly dispersing piezoelectric body particles 38 in a viscoelastic matrix 36 formed of a polymer material that exhibits viscoelasticity at normal temperature. It should be noted that in the present specification, the "normal temperature" refers to a temperature within a range of about 0° C. to 50° C.

As will be described later, it is preferable for the piezoelectric body layer 20 to have undergone polarization processing.

The conversion film 10 of the present invention is suitably used for a flexible speaker and the like, such as, for example, a speaker for a flexible display. Here, it is preferable for the polymeric composite piezoelectric body (piezoelectric body layer 20) used for a flexible speaker to satisfy the following requirements.

(i) Flexibility

For example, when a flexible display is gripped in a state of gently bent just like documents such as newspaper or a magazine as a portable apparatus, the display constantly and externally experiences severe bending deformation which is caused relatively slow and of which the frequency is several Hz or lower. At this time, if the polymeric composite piezoelectric body is hard, a bending stress as great as the hardness is caused. Consequently, the interface between the polymer matrix and particles of the piezoelectric body may crack and be broken in the end. Therefore, the polymeric composite piezoelectric body is required to have an appropriate degree of softness. If the stain energy can be caused to diffuse outside in the form of heat, the stress can be relaxed. Accordingly, the polymeric composite piezoelectric body is required to have an appropriate loss tangent.

(ii) Sound Quality

The speaker vibrates particles of the piezoelectric body at a frequency in an audio band of 20 Hz to 20 kHz, and causes the entire vibration plate (polymeric composite piezoelectric body) to vibrate as a whole by the vibrational energy, thereby reproducing sound. Therefore, in order to increase the transmission efficiency of the vibrational energy, the polymeric composite piezoelectric body is required to have an appropriate degree of hardness. If the speaker has smooth frequency characteristics, when the lowest resonance frequency $f_0$ varies with the change in curvature, the sound quality changes in a small extent. Consequently, the loss tangent of the polymeric composite piezoelectric body needs to be great appropriately.

To summarize, the polymeric composite piezoelectric body used for a flexible speaker is required to exhibit hardness with respect to vibration of 20 Hz to 20 kHz while exhibiting softness with respect to vibration of a frequency of several Hz or lower. Furthermore, the loss tangent of the polymeric composite piezoelectric body is required to be appropriately great with respect to vibration at all frequencies of 20 kHz or lower.

Generally, polymer solids have a viscoelasticity relaxation mechanism. By the temperature increase or the decrease in frequency, a large scale of molecular motion of the polymer solids is observed as the decrease (relaxation) in a storage modulus (Young's modulus) or as the maximum (absorption) of a loss modulus. Particularly, the relaxation resulting from micro-Browninan motion of a molecular chain in an amorphous region is called primary dispersion and observed as an extremely large degree of relaxation. A temperature at which the primary dispersion occurs is a glass transition temperature (Tg), and the viscoelasticity relaxation mechanism is the most markedly observed at this temperature.

In the polymeric composite piezoelectric body (piezoelectric body layer 20), a polymer material having the glass transition temperature in the range of normal temperature, that is, a polymer material exhibiting viscoelasticity at normal temperature is used as a matrix, whereby a polymeric composite piezoelectric body that exhibits hardness with respect to vibration of 20 Hz to 20 kHz while exhibiting softness with respect to slow vibration of a frequency of several Hz or lower is realized. Especially, from the viewpoint of causing the polymeric composite piezoelectric body to behave preferably as above, it is preferable to use a polymer material, which has a glass transition temperature at a frequency of 1 Hz in a range of normal temperature, as a matrix of the polymeric composite piezoelectric body.

As the polymer material exhibiting viscoelasticity at normal temperature, various known materials can be used. Among these, it is preferable to use polymer materials of which the maximum value of a loss tangent Tan δ at a frequency of 1 Hz is 0.5 or higher at normal temperature when the maximum value is measured by a dynamic viscoelasticity test.

If such materials are used, when the polymeric composite piezoelectric body is gently bent by the external force, stress concentration caused in a polymer matrix-piezoelectric body particles interface in a portion where a bending moment becomes maximum is relaxed, and accordingly, a high degree of flexibility may be expected.

Moreover, a storage modulus (E') at a frequency of 1 Hz of the polymer material that is obtained by dynamic viscoelasticity measurement is preferably 100 MPa or higher at 0° C. and 10 MPa or lower at 50° C.

If the polymer material has the above property, the bending moment caused when the polymeric composite piezoelectric body is gently bent by the external force can be reduced, and the polymeric composite piezoelectric body can exhibit hardness with respect to acoustic vibration of 20 Hz to 20 kHz.

It is more preferable for the polymer material to have a dielectric constant of 10 or higher at 25° C. If the polymer material has the above property, when voltage is applied to the polymeric composite piezoelectric body, a stronger electric field is applied to the piezoelectric body particles in the polymer matrix, hence larger degree of deformation may be expected.

However, on the other hand, a polymer material having a dielectric constant of less than 10 at 25° C. is also preferable in consideration of ensuring good moisture resistance or the like.

Examples of the polymer material satisfying the above conditions include cyanoethylated polyvinyl alcohol (cyanoethylated PVA), polyvinyl acetate, polyvinylidene chloride co-acrylonitrile, polystyrene-vinyl polyisoprene block copolymer, polyvinyl methyl ketone, polybutyl methacrylate, and the like. Further, commercially available products, such as HYBRAR 5127 (manufactured by Kuraray Co., Ltd.), are also suitably used as the polymer material.

Here, one kind of the polymer material may be used alone or plural kinds thereof may be used in combination (mixture).

In the viscoelastic matrix 36 in which the polymer material exhibiting viscoelasticity at normal temperature is used, a plurality of polymer materials may be used in combination, if necessary.

That is, for the purpose of adjusting dielectric characteristics, mechanical characteristics, and the like, other dielectric polymer materials may be optionally added to the viscoelastic matrix 36 in addition to the viscoelastic material such as cynoethylated PVA, if necessary.

Examples of the addible dielectric polymer material include fluorine-based polymers such as polyvinylidene fluoride, vinylidene fluoride-tetrafluoroethylene copolymers, vinylidene fluoride-trifluoroethylene copolymers, polyvinylidene fluoride-trifluoroethylene copolymers, and polyvinylidene fluoride-tetrafluoroethylene copolymers; cyano group- or cyanoethyl group-containing polymers such as vinylidene cyanide-vinyl acetate copolymers, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, and cyanoethyl sorbitol; synthetic rubbers such as nitrile rubber and chloroprene rubber, and the like.

Among these, the cyanoethyl group-containing polymer materials are suitably used.

In addition, the dielectric polymer that can be added to the viscoelastic matrix 36 of the piezoelectric body layer 20 in addition to the material exhibiting viscoelasticity at normal temperature such as cyanoethylated PVA is not limited to one kind, and plural kinds thereof may be added.

Furthermore, in addition to the dielectric polymer, a thermoplastic resin such as a vinyl chloride resin, polyethylene, polystyrene, a methacrylic resin, polybutene, and isobutylene, or a thermosetting resin such as a phenol resin, a urea resin, a melamine resin, an alkyd resin, and mica may be added for the purpose of adjusting a glass transition point Tg.

Moreover, a tackifier such as rosin ester, rosin, terpene, terpene phenol, and a petroleum resin may be added for the purpose of improving adhesiveness.

The amount of the polymer, which is added to the viscoelastic matrix 36 of the piezoelectric body layer 20, other than the viscoelastic material such as cyanoethylated PVA is not particularly limited. However, it is preferable for the polymer to be added in such an amount that a proportion of the polymer accounting for the viscoelastic matrix 36 becomes 30% by weight or less.

If the polymer is added in such an amount, characteristics of the added polymer material can be expressed without impairing the viscoelasticity relaxation mechanism in the viscoelastic matrix 36. Accordingly, from the viewpoints such as increase in a dielectric constant, improvement of heat resistance, and improvement of adhesiveness with the piezoelectric body particles 38 or the electrode layer, preferable results can be obtained.

The piezoelectric body particles 38 are formed of ceramics particles having a perovskite crystal structure or a wurtzite crystal structure.

Examples of the ceramic particles composing the piezoelectric body particles 38 include lead zirconate titanate (PZT), lead lanthanum zirconate titanate (PLZT), barium titanate ($BaTiO_3$), zinc oxide (ZnO), a solid solution (BFBT) consisting of barium titanate and bismuth ferrite ($BiFe_3$), and the like.

The particle size of the piezoelectric body particles 38 may be appropriately selected according to the size or use of the conversion film 10. However, according to the examination conducted by the present inventors, the particle size of the piezoelectric body particles 38 is preferably 1 μm to 10 μm.

If the particle size of the piezoelectric body particles 38 is within the above range, it is possible to obtain preferable results from the viewpoints that a high degree of piezoelectric characteristics becomes compatible with flexibility, and the like.

In FIG. 1 or the like, the piezoelectric body particles 38 in the piezoelectric body layer 20 have dispersed with regularity in the viscoelastic matrix 36. However, the present invention is not limited thereto.

That is, as long as the piezoelectric body particles 38 uniformly disperse in the piezoelectric body layer 20, they may not regularly disperse in the viscoelastic matrix 36.

In the conversion film 10 of the present invention, the ratio between the amount of the viscoelastic matrix 36 and the amount of the piezoelectric body particles 38 in the piezoelectric body layer 20 (polymeric composite piezoelectric body) may be appropriately set according to the size (size in the surface direction) or thickness of the conversion film 10, the use of the conversion film 10, characteristics required for the conversion film 10, and the like.

According to the examination conducted by the present inventors, the volumetric proportion of the piezoelectric body particles 38 in the piezoelectric body layer 20 is preferably 30% to 70% and particularly preferably 50% or higher. Therefore, the volumetric proportion is more preferably 50% to 70%.

If the ratio between the amount of the viscoelastic matrix 36 and the amount of the piezoelectric body particles 38 is within the above range, it is possible to obtain preferable results from the viewpoints that a high degree of piezoelectric characteristics becomes compatible with flexibility, and the like.

Moreover, in the conversion film 10 of the present invention, the thickness of the piezoelectric body layer 20 is not particularly limited. The thickness may be appropriately set according to the size and use of the conversion film 10, characteristics required for the conversion film 10, and the like.

According to the examination conducted by the present inventors, the thickness of the piezoelectric body layer 20 is preferably 10 μm to 300 μm, more preferably 20 μm to 200 μm, and particularly preferably 30 μm to 100 μm.

If the thickness of the piezoelectric body layer 20 is within the above range, it is possible to obtain preferable results from the viewpoints that securing of rigidity and appropriate flexibility can be established at the same time, and the like.

It should be noted that as described above, it is preferable for the piezoelectric body layer 20 to have undergone polarization processing (polling). The detail of the polarization processing will be described later.

As illustrated in FIG. 2A, in the conversion film 10 of the present invention, the piezoelectric laminate 12 has a configuration in which a first upper thin film electrode 24a and a second upper thin film electrode 24b are formed on one surface of the piezoelectric body layer 20, a first upper protective layer 26a and a second upper protective layer 26b are respectively formed on the first upper thin film electrode 24a and the second upper thin film electrode 24b, a first lower thin film electrode 30a and a second lower thin film electrode 30b are formed at positions on the other surface of the piezoelectric body layer 20 that respectively face the first upper thin film electrode 24a and the second upper thin film electrode 24b, a lower protective layer 32 is formed on the first lower thin film electrode 30a and the second lower thin film electrode 30b, and a side-surface insulating layer 60, that covers the piezoelectric body layer 20 at the end portions of the first and second upper protective layers 26a and 26b and at the periphery of the first and second upper protective layers 26a and 26b, is provided. Here, the first upper thin film electrode 24a and the first lower thin film electrode 30a form a first electrode pair, and the second upper thin film electrode 24b and the second lower thin film electrode 30b form a second electrode pair.

In FIGS. 1 and 2C, the side-surface insulating layer 60 is omitted.

In the following description, when it is not necessary to distinguish between the first upper protective layer 26a and the second upper protective layer 26b, the first and second upper protective layers 26a and 26b are simply referred to as an upper protective layer 26. When it is not necessary to distinguish between the first upper thin film electrode 24a and the second upper thin film electrode 24b, the first and second upper thin film electrodes 24a and 24b are simply referred to as an upper thin film electrode 24. When it is not necessary to distinguish between the first lower thin film electrode 30a and the second lower thin film electrode 30b, the first and second lower thin film electrodes 30a and 30b are simply referred to as a lower thin film electrode 30. The same applies to other components.

That is, the piezoelectric laminate 12 has a configuration in which each of the electrode pairs interposes a predetermined region of the piezoelectric body layer 20 therebetween (the upper thin film electrode 24 and the lower thin film electrode 30 interpose predetermined regions of the piezoelectric body layer 20 therebetween), and the upper protective layer 26 and the lower protective layer 32 interpose the resulting laminate therebetween.

Thus, each of the region interposed between the first upper thin film electrode 24a and the first lower thin film electrode 30a (first electrode pairs) and the region interposed between the second upper thin film electrode 24b and the second lower thin film electrode 30b (the second electrode pair) is driven (vibrated) according to a voltage applied thereto.

Here, in the present invention, the region interposed between the electrode pair is referred to as an active region. Further, the region interposed between the first electrode pair is referred to as a first active region, and the region interposed between the second electrode pair is referred to as a second active region.

That is, the electroacoustic conversion film 10 of the present invention has the two active regions that are respectively driven by signals different from each other.

Here, in the present invention, since the piezoelectric body layer 20 is formed by dispersing the piezoelectric body particles 38 in the viscoelastic matrix 36 formed of a polymeric material that exhibits viscoelasticity at normal temperature, the vibrations of the respective active regions do not interfere with each other, and thus, it is possible to perform satisfactory stereo reproduction using one vibration plate (electroacoustic conversion film 10). This point will be described later in detail.

In the conversion film 10, the upper protective layer 26 and the lower protective layer 32 play a role of imparting appropriate rigidity and mechanical strength to the piezoelectric body layer 20. That is, in the conversion film 10 of the present invention, the piezoelectric body layer 20 (polymeric composite piezoelectric body) composed of the viscoelastic matrix 36 and the piezoelectric body particles 38 exhibits excellent flexibility when suffering from gentle bending deformation. However, depending on the use thereof, the rigidity or mechanical strength of the piezoelectric body layer 20 is insufficient in some cases. The conversion film 10 is provided with the upper protective layer 26 and the lower protective layer 32 to correct such a flaw.

The upper protective layer 26 and the lower protective layer 32 are not particularly limited, and various sheet-like materials can be used. Preferable examples thereof include various resin films (plastic films). Among these, polyethylene terephthalate (PET), polypropylene (PP), polystyrene (PS), polycarbonate (PC), polyphenylene sulfide (PPS), polymethyl methacrylate (PMMA), polyetherimide (PEI), polyimide (PI), polyethylene naphthalate (PEN), triacetylcellulose (TAC), and cyclic olefin resins are preferably used since these have excellent mechanical characteristics and heat resistance.

The thickness of the upper protective layer 26 and the lower protective layer 32 is also not particularly limited. Basically, the upper protective layer 26 and the lower protective layer 32 have the same thickness, but the thickness may be different.

If the rigidity of the upper protective layer 26 and the lower protective layer 32 is too high, the expansion and contraction of the piezoelectric body layer 20 is restricted, and the flexibility is also impaired. Accordingly, except for the case that requires mechanical strength or excellent handleability as a sheet-like material, the thinner the upper protective layer 26 and the lower protective layer 32 are, the more advantageous the invention is.

According to the examination conducted by the present inventors, if the thickness of the upper protective layer 26 and the lower protective layer 32 is not greater than two times the thickness of the piezoelectric body layer 20, it is possible to obtain preferable results from the viewpoints that securing of rigidity and appropriate flexibility can be established at the same time, and the like.

For example, when the thickness of the piezoelectric body layer 20 is 50 µm, and the upper protective layer 26 and the lower protective layer 32 are formed of PET, the thickness of the upper protective layer 26 and the lower protective layer 32 is preferably 100 µm or less, more preferably 50 µm or less, and particularly preferably 25 µm or less.

In the conversion film 10 of the present invention, the upper thin film electrode 24 (hereinafter, also referred to as a "upper electrode") is formed between the piezoelectric body layer 20 and the upper protective layer 26, and the lower thin film electrode 30 (hereinafter, also referred to as a "lower electrode") is formed between the piezoelectric body layer 20 and the lower protective layer 32.

The upper electrode 24 and the lower electrode 30 are provided to apply an electric filed to the conversion film 10 (piezoelectric body layer 20).

In the present invention, the material forming the upper electrode 24 and the lower electrode 30 is not particularly limited, and various conductive materials can be used. Preferable examples thereof specifically include carbon, palladium, iron, tin, aluminum, nickel, platinum, gold, silver, copper, chromium, molybdenum, alloys of these, indium tin oxide, and the like. Among these, any one of copper, aluminum, gold, silver, platinum, and indium tin oxide is preferable.

Moreover, the formation method of the upper electrode 24 and the lower electrode 30 is not particularly limited, and it is possible to use various known methods including a film formation method implemented by a vapor-phase deposition method (vacuum film formation method) such as vacuum deposition or sputtering, or plating, and a method of sticking foil formed of the above material to the piezoelectric body layer.

Particularly, a thin film of copper or aluminum formed by vacuum deposition is preferably used as the upper electrode 24 and the lower electrode 30, since this film can secure flexibility of the conversion film 10. Especially, a thin copper film formed by vacuum deposition is suitably used.

The thickness of the upper electrode 24 and the lower electrode 30 is not particularly limited. Basically, the upper electrode 24 and the lower electrode 30 have the same thickness, but the thickness may be different.

As the upper protective layer 26 and the lower protective layer 32 described above, if the rigidity of the upper electrode 24 and the lower electrode 30 is too high, the expansion and contraction of the piezoelectric body layer 20 is restricted, and the flexibility is impaired. Accordingly, the thinner the upper electrode 24 and the lower electrode 30 are, the more advantageous the invention is, as long as the electric resistance does not become too high.

According to the examination conducted by the present inventors, it is preferable that a product of the thickness of the upper and lower electrodes 24 and 30 and a Young's modulus thereof be smaller than a product of the thickness of the upper and lower protective layers 26 and 32 and a Young's modulus thereof, since the flexibility is not significantly impaired.

For example, when a combination of the upper and lower protective layers 26 and 32 formed of PET (Young's modulus: about 6.2 GPa) and the upper and lower electrodes 24 and 30 formed of copper (Young's modulus: about 130 GPa) is used, provided that the thickness of the upper and lower protective layers 26 and 32 is 25 μm, the thickness of the upper and lower electrodes 24 and 30 is preferably 1.2 μm or less, more preferably 0.3 μm or less, and particularly preferably 0.1 μm or less.

Here, as will be described later in detail, the first upper electrode 24a (the first upper protective layer 26a) and the second upper electrode 24b (second upper protective layer 26b) in the example illustrated in FIGS. 1 and 2A have the same shape (same size), and have a size slightly smaller than half of the main surface of the piezoelectric body layer 20. Further, the first upper electrode 24a and the second upper electrode 24b are respectively arranged on the right side and the left side on the piezoelectric body layer 20 in the drawings, and a predetermined interspace is formed between the first upper electrode 24a and the second upper electrode 24b. A voltage is not applied to this region, and the region is a region (separation region) for separating the first active region and the second active region.

The width of the interspace between the first active region and the second active region (the width of the separation region) is preferably 1 mm or more, and more preferably 10 mm or more. If the width of the separation region is 1 mm or more, it is possible to more reliably prevent the vibrations of the first active region and the second active region from interfering with each other.

An upper limit of the width of the separation region is not particularly limited, and it may be appropriately determined depending on a size or the like of the electroacustic conversion film 10.

As will be described later in detail, the first lower electrode 30a and the second lower electrode 30b in the example illustrated in FIGS. 1 and 2A have the same shape (the same size), and have approximately half the size of the main surface of the piezoelectric body layer 20. Further, the first lower electrode 30a and the second lower electrode 30b are respectively arranged on the right side and the left side on the piezoelectric body layer 20 in the drawings, and the same interspace (separation region) as that between the upper electrodes 24a and 24b is formed between the first lower electrode 30a and the second lower electrode 30b.

The entire main surface on the lower side of the piezoelectric body layer 20 including the lower electrode 30 is covered with the lower protective layer 32.

As described above, the piezoelectric laminate 12 used in the conversion film 10 of the present invention has a configuration in which the piezoelectric body layer 20 (polymeric composite piezoelectric body) formed by dispersing the piezoelectric body particles 38 in the viscoelastic matrix 36 exhibiting viscoelasticity at normal temperature is interposed between the upper electrode 24 and the lower electrode 30, and the resulting laminate is interposed between the upper protective layer 26 and the lower protective layer 32.

In the piezoelectric laminate 12, it is preferable that the maximum value of a loss tangent (Tan δ) at a frequency of 1 Hz, which is 0.1 or higher and is obtained by dynamic viscoelasticity measurement, is present at normal temperature.

If the maximum value is present at normal temperature, even if the conversion film 10 externally experiences severe bending deformation which is caused relatively slow and of which the frequency is several Hz or lower, the stain energy can be caused to effectively diffuse outside in the form of heat. Accordingly, it is possible to prevent the interface between the polymer matrix and the piezoelectric body particles from cracking.

Furthermore, a storage modulus (E') at a frequency of 1 Hz of the piezoelectric laminate 12 that is obtained by dynamic viscoelasticity measurement is preferably 10 GPa to 30 GPa at 0° C. and 1 GPa to 10 GPa at 50° C.

If the storage modulus is as above, the conversion film 10 can have large frequency dispersion in the storage modulus (E') at normal temperature. That is, the conversion film 10 can exhibit hardness with respect to vibration of 20 Hz to 20 kHz while exhibiting softness with respect to vibration of a frequency of several Hz or lower.

In addition, in the piezoelectric laminate 12, a product of the thickness of the piezoelectric laminate 12 and the storage modulus (E') at a frequency of 1 Hz of the piezoelectric laminate 12 that is obtained by dynamic viscoelasticity measurement is preferably $1.0 \times 10^6$ N/m to $2.0 \times 10^6$ N/m (1.0 E+06 N/m to 2.0 E+06 N/m) at 0° C. and $1.0 \times 10^5$ N/m to $1.0 \times 10^6$ N/m (1.0 E+05 N/m to 1.0 E+06 N/m) at 50° C.

If the product is within the above range, the conversion film 10 can have appropriate rigidity and mechanical strength within a range that does not impair flexibility and acoustic characteristics.

Moreover, in the piezoelectric laminate 12, it is preferable that the loss tangent (Tan δ) at a frequency of 1 kHz at 25° C. of the piezoelectric laminate 12 is 0.05 or higher in a master curve obtained by dynamic viscoelasticity measurement.

If the loss tangent is as above, the speaker using the conversion film 10 has smooth frequency characteristics, and thus, when the lowest resonance frequency to varies with the change in the curvature of the speaker, a degree of change in the sound quality can be reduced.

As described above, the conversion film 10 of the present invention has the first insulating sheet 14a, the second insulating sheet 14b, the first lead-out metal foil for upper electrode 16a, the second lead-out metal foil for upper electrode 16b, the first lead-out metal foil for lower electrode 18a, the second lead-out metal foil for lower electrode 18b, and the side-surface insulating layer 60, in addition to the piezoelectric laminate 12.

The insulating sheet 14 is a sheet-like material formed of a material having insulating properties, such as, for example, a polyimide tape or the like. Further, the lead-out metal foil for upper electrode 16 and the lead-out metal foil for lower electrode 18 are sheet-like material formed of a metal material having electrical conductivity, such as, for example, a copper foil film or the like.

As described above, in the conversion film 10 of the illustrated example, the upper electrode 24 and the upper protective layer 26 have the same shape. In the upper electrode 24 and the upper protective layer 26, upper electrode lead-out portions, which protrude convexly in a surface direction from the rectangular main surfaces thereof, are formed (hereinafter, the portions are also collectively referred to as an upper protruded island portion 40 (a first upper protruded island portion 40a and a second upper protruded island portion 40b)) (see FIG. 4C).

As illustrated in FIG. 2B, the first lead-out metal foil for upper electrode (hereinafter also referred to as an upper metal foil) 16a is provided to be laminated on the first upper electrode 24a in the first upper protruded island portion 40a. Similarly, the second lead-out metal foil for upper electrode 16b is provided to be laminated on the second upper electrode 24b in the second protruded island portion 40b. In the illustrated example, as a preferred embodiment, the upper metal foil 16 is provided so as to be folded back in a protrusion direction of the upper protruded island portion 40 and to sandwich the upper electrode 24 and the upper protective layer 26 from both sides. Further, as a preferred embodiment, the upper metal foil 16 may be folded back such that the end portion thereof reaches up to an inward region beyond the upper protruded island portion 40.

Figure 4A:
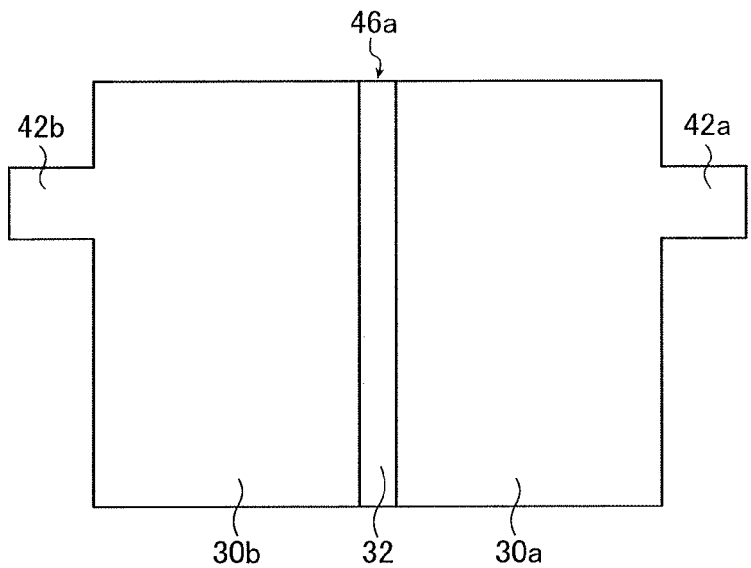
FIGS. 4A to 4C are conceptual views explaining an example of a method of preparing the electroacoustic conversion film illustrated in FIG. 1.

Similarly, as illustrated in FIG. 2C and the like, also in the lower electrodes 30a and 30b and the lower protective layer 32, lower electrode lead-out portions, which protrude convexly in a surface direction from the rectangular main surfaces thereof, are formed (hereinafter, the portions are also collectively referred to as a lower protruded island portion 42 (a first lower protruded island portion 42a and a second lower protruded island portion 42b)) (see FIG. 4A).

As conceptually illustrated in FIG. 2C, the first lead-out metal foil for lower electrode (hereinafter also referred to as a first lower metal foil) 18a is laminated on the lower electrode 30a of the first lower protruded island portion 42a. Similarly, the second lower metal foil 18b is laminated on the lower electrode 30b of the second lower protruded island portion 42b. As will be described later, in the illustrated example, the lower metal foil 18 is provided such that the end portion thereof is inserted into the piezoelectric body layer 20. Further, in the illustrated example, as a preferred embodiment, the lower metal foil 18 is provided so as to be folded back in a protrusion direction of the lower protruded island portion 42 and to sandwich the lower electrode 30 and the lower protective layer 32 from both sides.

Furthermore, in the conversion film 10 of the present invention, the insulating sheet (insulating layer) 14 (the first insulating sheet 14a and the second insulating sheet 14b) is inserted between the upper electrode 24 and the piezoelectric body layer 20 in the formation position of the upper protruded island portion 40.

This insulating sheet 14 is provided such that in a surface direction, it encompasses the entire region of the upper protruded island portion 40 in a direction (a vertical direction in FIG. 1; hereinafter also referred to a width direction) orthogonal to the protrusion of the upper island portion 40 and protrudes from the end portion of the piezoelectric body layer 20 in a protrusion direction (hereinafter also referred to a longitudinal direction) of the upper protruded island portion 40.

In the conversion film 10 of the present invention, the upper metal foil 16 and the lower metal foil 18 connected to the upper electrode 24 and the lower electrode 30 are provided to lead out the electrodes from the upper electrode 24 and the lower electrode 30, to reinforce both electrodes that are thin films, and to enable the electrodes to be wired and connected by soldering. Further, each of the upper metal foil 16 and the lower metal foil 18 is preferably folded back so as to sandwich the electrode and the protective layer from both sides, and thereby, the electrode can be more suitably reinforced, and it becomes possible to select a surface on which soldering to connect wiring is performed.

In addition, in the configuration in which the upper electrode 24 is led out by the above-described upper protruded island portion 40 and the upper metal foil 16, by providing the insulating sheet 14, the upper metal foil 16 and the lower electrode 30 can be electrically insulated even if the upper metal foil 16 comes in contact with the end surface of the piezoelectric laminate 12. For example, when the conversion film 10 is incorporated into a case, the upper metal foil 16 and the lower electrode 30 can be electrically insulated even when the upper metal foil 16 crosses the end portion of the piezoelectric laminate 12. That is, by providing the insulating sheet 14, the lead-out of the aforementioned electrode layers can be performed while ensuring the insulation between the upper electrode 24 and the lower electrode 30.

Furthermore, in the illustrated example, as a preferred embodiment, the upper protruded island portion 40 and the lower protruded island portion 42 are provided, and the upper metal foil 16 and the lower metal foil 18 are laminated thereon.

With this configuration, the upper metal foil 16 and the lower metal foil 18 can be arranged to be spaced apart from a region acting as a speaker of the piezoelectric laminate 12, and thus, the upper metal foil 16 and the lower metal foil 18 that are thicker than the upper electrode 24 and the lower electrode 30 do not interfere with the vibration of the piezoelectric body layer 20.

As described above, the end portion of the lower metal foil 18 is in a state of being inserted into the piezoelectric body layer 20. However, the region acting as a speaker or the like in the conversion film 10 is a region in which the upper electrode 24 and the lower electrode 30 face each other. In addition, the upper electrode 24 is smaller than the lower electrode 30. Therefore, since the region in which the lower metal foil 18 and the piezoelectric body layer 20 overlap each other does not act as a speaker or the like, this region does not adversely affect the acoustic properties of the conversion film 10.

As for the width (a direction orthogonal to the protrusion of the upper protruded island portion 40 in a surface direction; a vertical direction in FIG. 1) and length (a direction orthogonal to the width direction) of the upper protruded island portion 40 and the lower protruded island portion 42, a size capable of leading out the electrodes and ensuring conductivity with the outside at the time of implementation of the conversion film 10 may be appropriately set. Further, other than the rectangular shape in the illustrated example, a variety of shapes capable of leading out the upper electrode 24 and the lower electrode 30 can also be used as the shape of the upper protruded island portion 40 and the lower protruded island portion 42.

The size and shape of the upper metal foil 16 and the lower metal foil 18 may be appropriately set according to the size and shape of the upper protruded island portion 40 and the lower protruded island portion 42, so that conductivity with the upper protruded island portion 40 and the lower protruded island portion 42 can be ensured, and connection to wiring can be made at the time of implementation of the conversion film 10.

Both of the upper protruded island portion 40 and the lower protruded island portion 42 may be provided, or any one of them may be provided. In the case in which any one of the upper protruded island portion 40 and the lower protruded island portion 42 is provided, it is preferable to provide the upper protruded island portion 40.

The upper metal foil 16 and the lower metal foil 18 may be formed of a variety of conductive materials. Specifically, copper, aluminum, gold, silver, and the like are suitably exemplified.

As the attachment method of the upper metal foil 16 and the lower metal foil 18, various known attachment methods of a sheet-like material can be used according to the material forming the metal foils.

As for the thickness of the upper metal foil 16 and the lower metal foil 18, a thickness capable of ensuring sufficient strength and being subjected to soldering may be appropriately determined according to the material forming the metal foils, and the like.

Meanwhile, the insulating sheet 14 may be formed of various materials having insulating properties. Specifically, PI, PET, PEN, PP, TAC and the like are preferably exemplified. Among these, polyimide is preferably used.

As the attachment method of the insulating sheet 14, various known attachment methods of a sheet-like material may be used according to the material forming the insulating sheet 14.

As for the thickness of the insulating sheet 14, a thickness capable of ensuring insulating properties may be appropriately set, according to the material thereof and the like. Here, considering the acoustic properties of the conversion film 10, a thinner insulating sheet 14 is preferable in a range in which insulating properties can be ensured.

The length in the longitudinal direction of the insulating sheet 14 may be set such that the insulating sheet 14 can be reliably inserted between the upper electrode 24 and the piezoelectric body layer 20 in a range in which it does not reach the main surface of the upper electrode 24, and a protrusion amount thereof from the end portion of the piezoelectric body layer 20 is equal to or larger than the thickness of the piezoelectric laminate 12.

In the illustrated example, as a preferred embodiment, the upper protruded island portion 40 and the lower protruded island portion 42 (that is, the electrode lead-out portions from the upper and lower electrode layers) are formed on the same side of the conversion film 10. However, the upper protruded island portion 40 and the lower protruded island portion 42 may be formed on different sides to lead out the electrodes, corresponding to the configuration or the like of the conversion film 10 at the time of implementation of the conversion film 10 as a speaker.

Further, in the illustrated example, although the upper protruded island portion 40 and the lower protruded island portion 42 are formed at positions that do not overlap each other, the upper protruded island portion 40 and the lower protruded island portion 42 may be formed at positions that overlap each other.

The side-surface insulating layer 60 is a layer intended to prevent a short circuit or the like by covering the exposed regions of the piezoelectric body layer 20. Specifically, as illustrated in FIG. 2A and the like, the side-surface insulating layer 60 covers the piezoelectric body layer 20 at the end portions of the upper protective layer 26 (upper electrode 24), the periphery of the upper protective layer 26 and the separation region, and thereby, it is possible to prevent an electric shock or the like caused by a user touching the end portion of the upper electrode 24.

Figure 5:
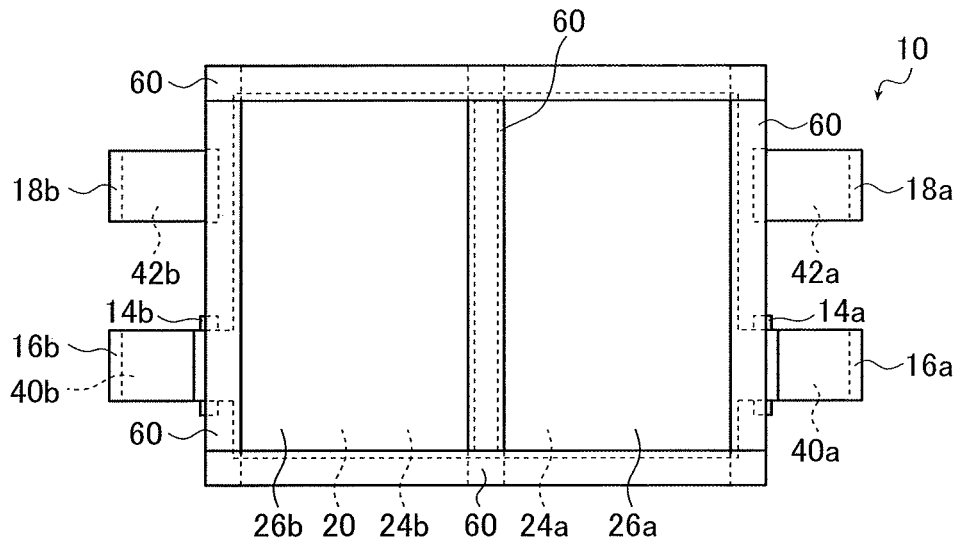
FIG. 5 is a view conceptually illustrating an example of the electroacoustic conversion film of the present invention.

In the example illustrated in FIGS. 1 and 2A, the upper protective layer 26 and the piezoelectric body layer 20 around the upper protective layer 26 are covered with five strip-like side-surface insulating layers 60 (see FIG. 5).

The side-surface insulating layer 60 may be formed of various materials having insulating properties. Specifically, the materials exemplified in the aforementioned insulating sheet 14 are suitably exemplified. Among them, polyimide is preferably used.

As the attachment method of the side-surface insulating layer 60, various known attachment methods of a sheet-like material can be used according to the material forming the side-surface insulating layer 60.

In FIG. 5, the upper protective layer 26 and the piezoelectric body layer 20 around the upper protective layer 26 are covered with the five strip-like side-surface insulating layers 60, but other than the side-surface insulating layer 60 illustrated in the drawing, side-surface insulating layers 60 having various shapes, such as a frame shape and the like, can be used.

Hereinafter, the conversion film 10 of the present invention will be described in more detail by explaining an example of the method of preparing the conversion film 10 with reference to FIGS. 3A to 3E, FIGS. 4A to 4C, and FIG. 5.

Here, FIGS. 3A to 3C and 3E are views when the conversion film 10 is viewed from a lower side of FIG. 1.

Figure 3A:
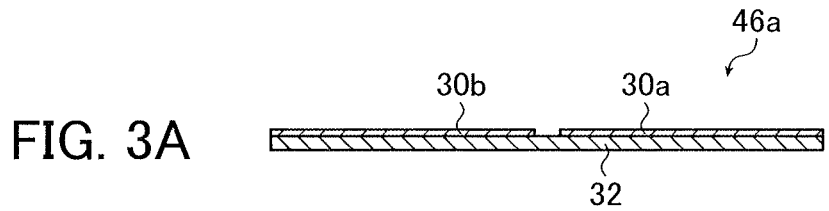
FIGS. 3A to 3E are conceptual views explaining an example of a method of preparing the electroacoustic conversion film illustrated in FIG. 1.

First, as illustrated in FIG. 3A, a sheet-like material 46*a* in which the lower electrode 30 is formed on the lower protective layer 32 is prepared. Here, as illustrated in FIG. 4A, the first lower electrode 30*a* and the second lower electrode 30*b* have approximately half the size of the main surface of the lower protective layer 32, and are arranged on the right side and the left side in FIG. 4A, respectively. The lower protective layer 32 has a region, in which an electrode is not formed and which corresponds to the separation region, between the first lower electrode 30a and the second lower electrode 30b. In such a sheet-like material 46a, the two lower electrodes 30a and 30b have been patterned in a predetermined shape on the lower protective layer 32.

The sheet-like material 46a may be prepared by forming a thin copper film or the like as the lower electrode 30 on the surface of the lower protective layer 32 by means of vacuum deposition, sputtering, plating, or the like.

When the lower protective layer 32 is very thin and handleability is poor, the lower protective layer 32 with a separator (temporary support) may be used, if necessary. For example, PET having a thickness of 25 μm to 100 μm may be used as the separator. After thermocompression bonding of the thin film electrode and the protective layer, immediately before the side-surface insulating layer, the second protective layer, or the like is formed, the separator may be removed.

Meanwhile, a polymer material (hereinafter, also referred to as a "viscoelastic material") such as cyanoethylated PVA that exhibits viscoelasticity at room temperature is dissolved in an organic solvent, the piezoelectric body particles 38 such as PZT particles are added thereto and dispersed by stirring, whereby a coating material is prepared. The organic solvent is not particularly limited, and various organic solvents such as dimethylformamide (DMF), methyl ethyl ketone, and cyclohexanone can be used.

Figure 3B:
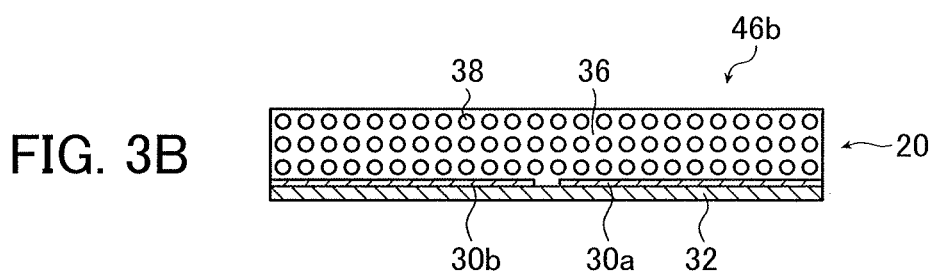

After the above sheet-like substance 46a and the coating material are prepared, the coating material is casted (coated) to the sheet-like substance 46a, and the organic solvent is evaporated to dry the resultant. In this manner, as illustrated in FIG. 3B, a laminate 46b in which the lower electrode 30 is on the lower protective layer 32 and the piezoelectric body layer 20 is on the lower electrode 30 is prepared.

The casting method of the coating material is not particularly limited, and all of the known methods (coating apparatuses) such as a slide coater or a doctor knife can be used.

Alternately, if the viscoelastic material is a material that can be melted by heating just like cyanoethylated PVA, the viscoelastic material may be melted by heating, and the piezoelectric body particles 38 may be added and dispersed into the resultant to prepare a melt. By extrusion molding or the like, the melt may be extruded in the form of sheet onto the sheet-like substance shown in FIG. 3A and then cooled, whereby the laminate 46b in which the lower electrode 30 is on the lower protective layer 32 and the piezoelectric body layer 20 is on the lower electrode 30 as illustrated in FIG. 3B may be prepared.

As described above, in the conversion film 10 of the present invention, piezoelectric polymer materials such as PVDF and the like may be added to the viscoelastic matrix 36 in addition to the viscoelastic material such as cyanoethylated PVA.

When being added to the viscoelastic matrix 36, the polymer piezoelectric polymer material to be added may be dissolved in the aforementioned coating material. Alternately, the polymer piezoelectric polymer material to be added may be added to the viscoelastic material melted by heating, and the resultant may be melted by heating.

After the laminate 46b in which the lower electrode 30 is on the lower protective layer 32 and the piezoelectric body layer 20 is on the lower electrode 30 is prepared, it is preferable to perform polarization processing (polling) on the piezoelectric body layer 20.

The method of the polarization processing performed on the piezoelectric body layer 20 is not particularly limited, and the known methods can be used. Examples of preferable polarization methods include the method described in FIGS. 3C and 3D.

Figure 3C:
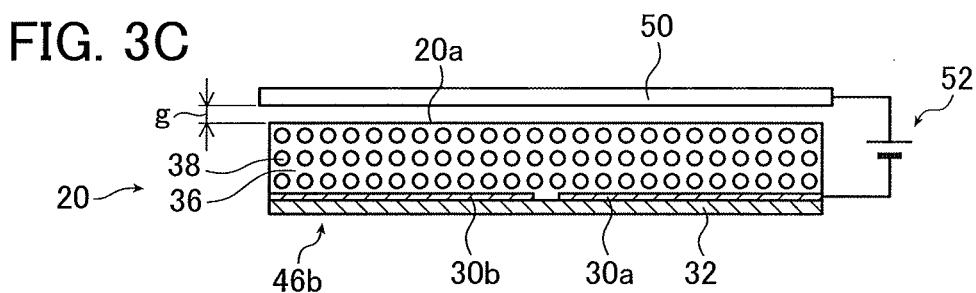
Figure 3D:
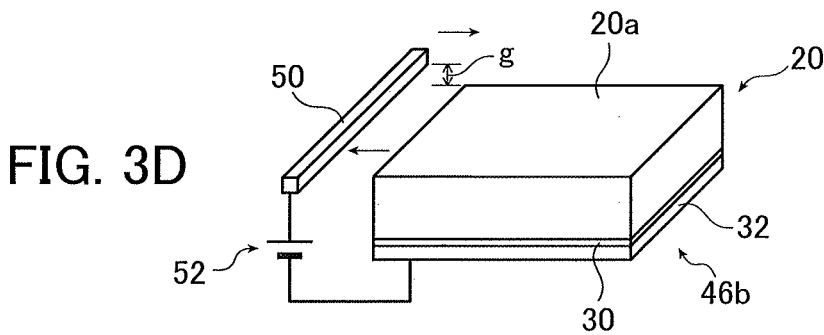

In this method, as shown in FIGS. 3C and 3D, a rod-like or wire-like movable corona electrode 50 is placed above an upper surface 20a of the piezoelectric body layer 20 of the laminate 46b along the upper surface 20a, in a state where there is a space g of, for example, 1 mm, between the electrode and the upper surface. Then the corona electrode 50 and the lower electrode 30 are connected to a DC power supply 52.

Moreover, heating means for heating and holding the laminate 46b, for example, a hot plate is prepared.

Thereafter, in a state where the piezoelectric body layer 20 is heated and held by the heating means at, for example, 100° C., DC voltage of several kV, for example, 6 kV, is applied between the lower electrode 30 and the corona electrode 50 from the DC power supply 52, whereby corona discharge is caused to occur. Moreover, in a state where the space g is maintained as is, the corona electrode 50 is moved (caused to scan) along the upper surface 20a of the piezoelectric body layer 20 to perform polarization processing on the piezoelectric body layer 20.

In the polarization processing using corona discharge as above (hereinafter, for convenience, the processing will also be referred to as corona polling processing), the corona electrode 50 may be moved by using the known rod-like moving means.

In addition, in the corona polling processing, the method thereof is not limited to the method in which the corona electrode 50 is moved. That is, the corona electrode 50 may be fixed, and a moving mechanism for moving the laminate 46b may be provided to move the laminate 46b for performing the polarization processing. For moving the laminate 46b, the known sheet-like moving means may be used.

Moreover, the number of the corona electrode 50 is not limited to one, and plural corona electrodes 50 may be used for performing corona polling processing.

Furthermore, the polarization processing is not limited to the corona polling processing, and it is possible to use ordinary electric field polling that directly applies direct electric field to a target to be subjected to the polarization processing. Here, for performing the ordinary electric field polling, the upper electrode 24 needs to be formed before the polarization processing.

Before the polarization processing, calendar processing for smoothening the surface of the piezoelectric body layer 20 by using a heating roller or the like may be performed. If the calendar processing is performed, a thermocompression bonding step, which will be described later, can be smoothly conducted.

Figure 4B:
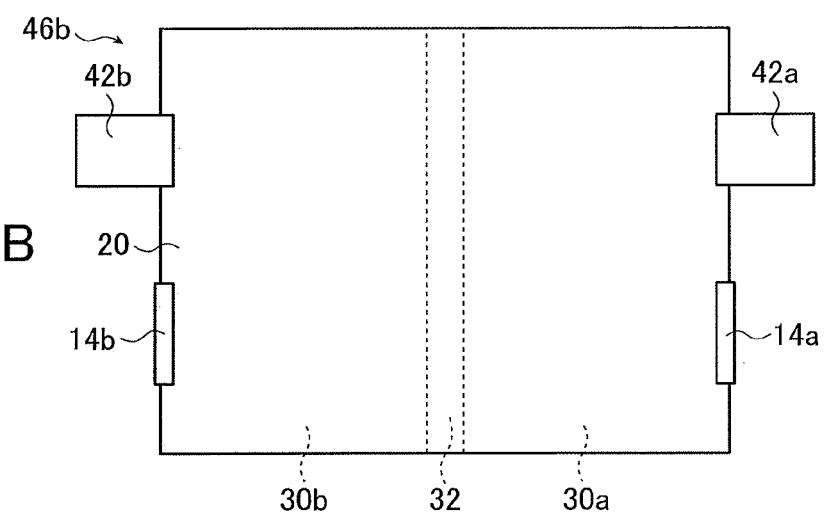

If the polarization processing of the piezoelectric body layer 20 of the laminate 46b is performed in the aforementioned manner, then the piezoelectric body layer 20 is removed in the lower protruded island portion 42 and a region located slightly inward from the lower protruded island portion 42 (center side of the laminate 46b) to expose the lower electrode 30, as illustrated in FIG. 4B. As the method of removing the piezoelectric body layer 20, for example, a method of dissolving and removing the piezoelectric body layer 20 by impregnating a cotton swab or the like with a solvent capable of dissolving the viscoelastic matrix 36, and rubbing the piezoelectric body layer 20 with the cotton swab or the like is exemplified.

Furthermore, the insulating sheet 14 is arranged at a position corresponding to the upper protruded island portion 40.

Meanwhile, a sheet-like material 46c in which the upper electrode 24 is formed on the upper protective layer 26 is prepared. The sheet-like material 46c may be prepared by forming a thin copper film or the like as the upper electrode 24 on the surface of the upper protective layer 26 by means of vacuum deposition, sputtering, plating, or the like.

Figure 4C:
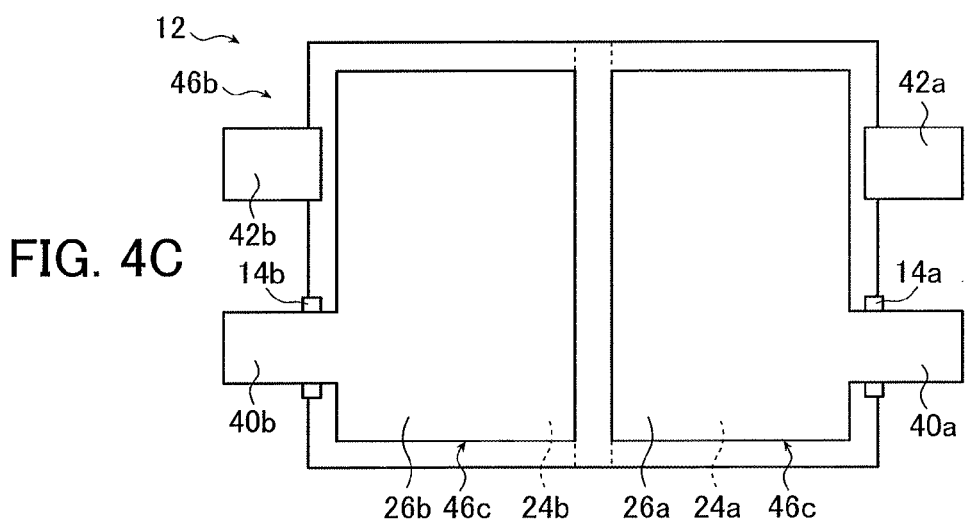

As illustrated in FIG. 4C, this sheet-like material 46c is cut according to the shape of the conversion film 10 (the shape of the active region). That is, in the illustrated example, the sheet-like material 46c is cut to be a form in which the rectangular upper protruded island portion 40 is formed to protrude from the rectangular main surface of a rectangle corresponding to each of the first active region and the second active region, as illustrated in FIG. 4C. Here, the sheet-like material 46c is cut to be smaller than the lower electrodes 30a and 30b described above.

Figure 3E:
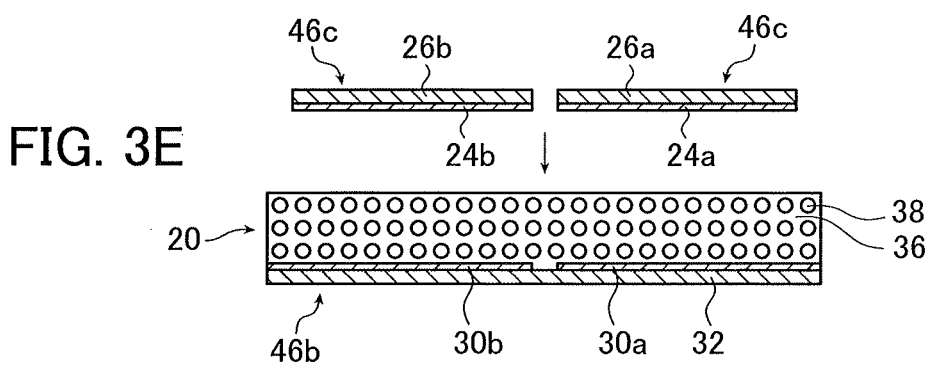

Thereafter, as illustrated in FIGS. 3E and 4C, the cut sheet-like material 46c is laminated on the laminate 46b having undergone the polarization processing of the piezoelectric body layer 20 in a state in which the upper electrode 24 faces the piezoelectric body layer 20. Since the sheet-like material 46c is smaller than the laminate 46b as described above, the sheet-like material 46c is laminated on the laminate 46b such that a margin of the piezoelectric body layer 20 is formed in the entire periphery of the upper electrode 24 and the upper protective layer 26. Further, the sheet-like material 46c to be the first upper electrode 24a (the first upper protective layer 26a) and the sheet-like material 46c to be the second upper electrode 24 (the second upper protective layer 26b) are spaced apart at a predetermined distance and arranged side by side.

Moreover, the laminate of the laminate 46b and the sheet-like material 46c is subjected to thermocompression bonding by using a heating press apparatus or a pair of heating roller, in a state in which the laminate is interposed between the upper protective layers 26 and the lower protective layer 32. In this manner, the piezoelectric laminate 12 in which the insulating sheet 14 is interposed at a position corresponding to the upper protruded island portion 40 is prepared.

In the present embodiment, the upper electrode 24 and the upper protective layer 26 are subjected to thermocompression bonding after the laminate 46 is cut into a predetermined shape. However, the preparation of the piezoelectric laminate 12 is not necessarily performed in this order. For example, the upper electrode 24 and the upper protective layer 26 may be subjected to thermocompression bonding, and then, the laminate 46 may be cut into a predetermined shape.

After the piezoelectric laminate 12 is prepared as above, the upper metal foil 16 is laminated on the upper electrode 24 (upper electrode lead-out portion) of the upper protruded island portion 40, as illustrated in FIG. 5. If necessary, the upper metal foil 16 is folded back so as to sandwich the upper electrode 24 and the upper protective layer 26 from both sides. In a preferred embodiment, the upper metal foil 16 may be folded back such that the end portion thereof reaches up to an inward region beyond the upper protruded island portion 40.

Furthermore, the lower metal foil 18 is laminated on the lower electrode 30 (lower electrode lead-out portion) of the lower protruded island portion 42. If necessary, the lower metal foil 18 is folded back so as to sandwich the lower electrode 30 and the lower protective layer 32 from both sides.

Moreover, the piezoelectric body layer 20 in the end portions of the upper protective layer 26 (upper electrode 24), and the periphery and the separation region of the upper protective layer 26 is covered with the side-surface insulating layer 60, thereby completing the conversion film 10 of the present invention illustrated in FIGS. 1 and 2A. Here, the lower metal foil 18 is laminated on the lower protruded island portion 42 or further folded back such that the end portion of the lower metal foil 18 reaches up to an inward region beyond the lower protruded island portion 42 in which the lower electrode 30 is exposed beforehand.

Thus, in the electroacoustic conversion film 10 of the present invention, the polymeric composite piezoelectric body formed by dispersing the piezoelectric body particles 38 in the viscoelastic matrix 36 formed of a polymer material that exhibits viscoelasticity at normal temperature is used as the piezoelectric body layer 20, and the two electrode pairs each of which interposes the piezoelectric body layer 20 therebetween are formed to form two active regions. Accordingly, in a speaker using the electroacoustic conversion film 10 as a vibration plate, it is possible to perform reproduction with high sound quality in a broad frequency band, and even when different signals are input to the respective active regions (voltages are applied) to reproduce audio signals, it is possible to suitably reproduce the audio signals in the respective active regions without causing the vibrations of the respective active regions to interfere with each other. For example, it is possible to perform satisfactory stereo reproduction by inputting a signal of an R channel to the first active region (first electrode pair) and inputting a signal of an L channel to the second active region (second electrode pair).

Figure 6:
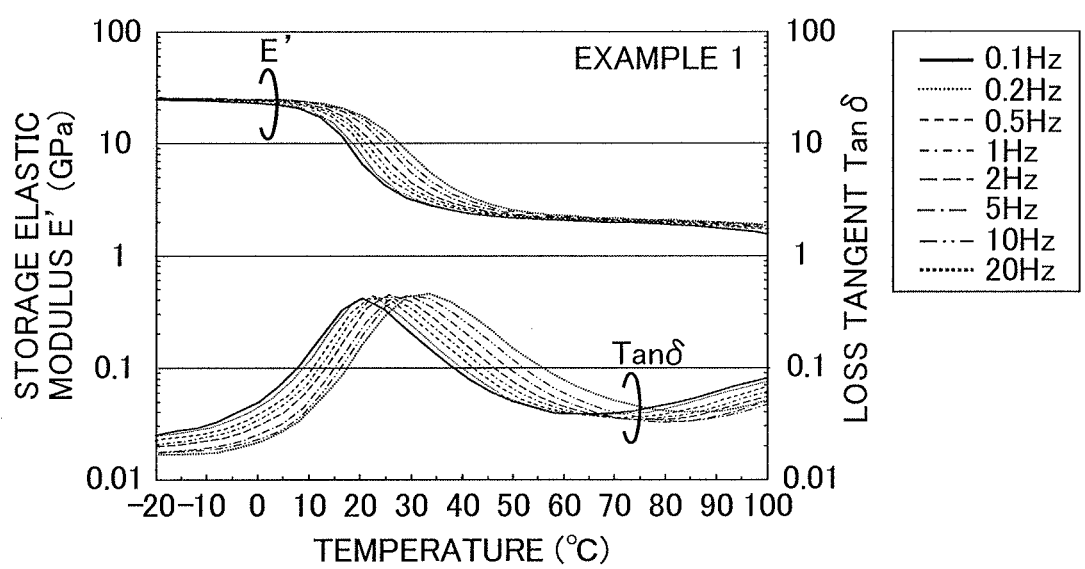
FIG. 6 is a diagram illustrating temperature dependence of dynamic viscoelasticity in the electroacoustic conversion film of the present invention.
Figure 7:
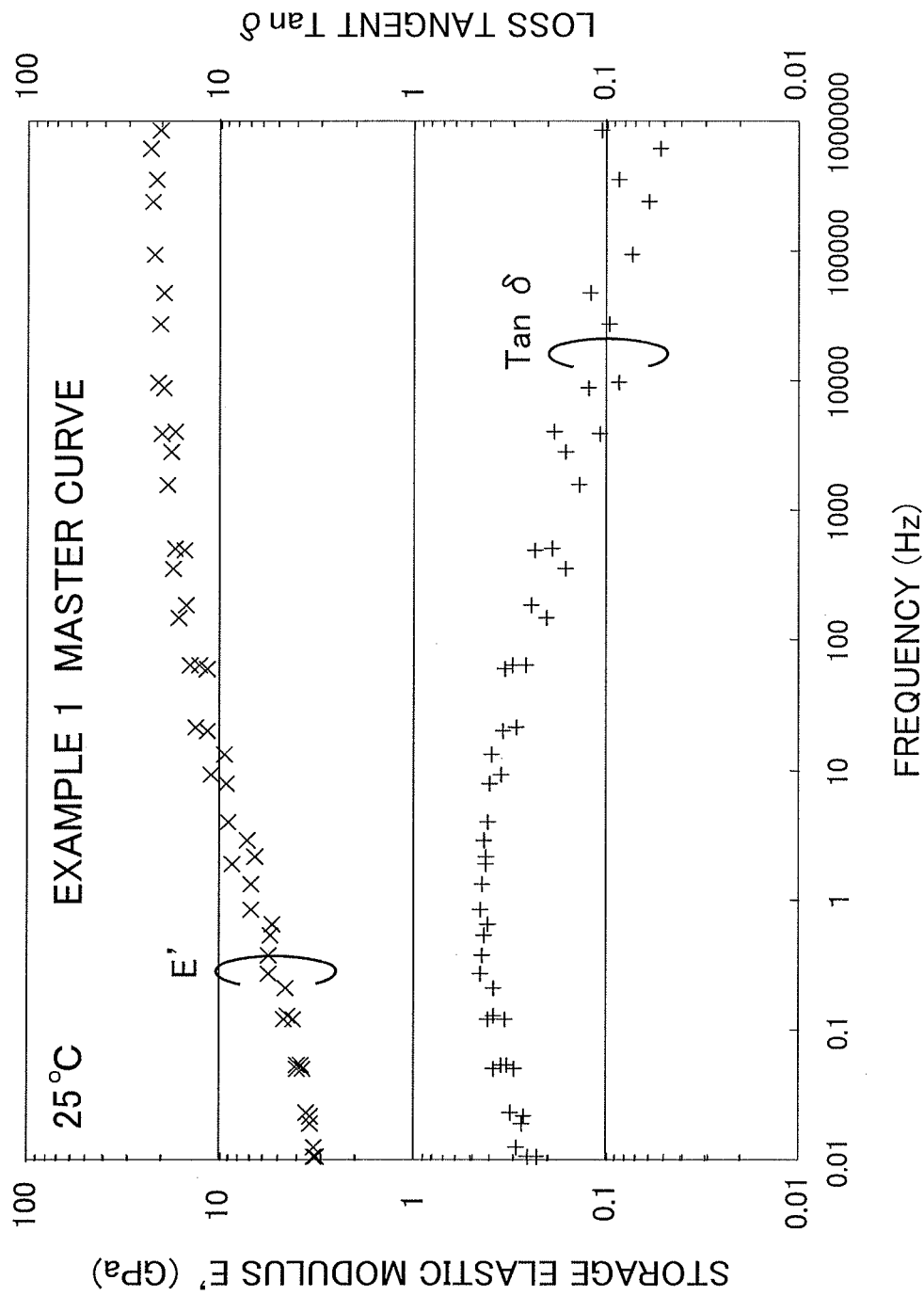
FIG. 7 is a diagram illustrating a master curve obtained from dynamic viscoelasticity measurement of the electroacoustic conversion film of the present invention.

Here, FIG. 6 illustrates a result of preparing a specimen of the conversion film and measuring temperature dependence of dynamic viscoelasticity, and FIG. 7 illustrates a master curve at a reference temperature of 25° C., which is obtained from dynamic viscoelasticity measurement.

The master curve shows frequency dispersion of viscoelastic properties at a certain temperature. In general, there is a certain relationship based on a "time-temperature conversion rule" between the frequency and the temperature in the dynamic viscoelasticity measurement result. For example, the change in temperature can be converted into a change in frequency, and frequency dispersion of the viscoelastic properties at a certain temperature can be determined. A curve created at this time is referred to as a master curve. Since the viscoelasticity measurement in an actual audio band, such as 1 kHz, is not practical, the master curve is effective for grasping a storage elastic modulus E' or a loss tangent Tan δ of the material in the audio band.

The conversion film of the present invention has a region (separation region) to which no signal is applied. This separation region always shows rheological properties at a frequency of 0 Hz. Here, as illustrated in FIG. 7, in the conversion film of the present invention, when the frequency is approximately 0 Hz, the internal loss (loss tangent Tan δ) is large and the storage elastic modulus E' is small, and thus, the speed of sound is low. Therefore, the vibrations from the respective active regions can be canceled in the separation region, and the propagation of the vibration from one of the active regions to the other active region can be prevented. Thus, even when different signals are input to the respective active regions and reproduced, it is possible to preferably reproduce audio signals in the respective regions without causing the vibrations of the respective active regions to interfere with each other.

The graphs illustrated in FIGS. 6 and 7 show the results of the measurement performed by the following test using a specimen of the conversion film prepared by the method described in examples which will be specifically described later.

[Dynamic Viscoelasticity Test]

From the prepared conversion film 10, a strip specimen of 1 cm×4 cm was prepared.

The dynamic viscoelasticity (storage elastic modulus E' (GPa) and loss tangent Tan δ) of the specimen was measured using a dynamic viscoelasticity tester (DMS6100 viscoelasticity spectrometer manufactured by SII NanoTechnology Inc.). The measurement was performed under the following conditions.

Range of measurement temperature: −20° C. to 100° C.
Rate of temperature increase: 2° C./min
Measurement frequency: 0.1 Hz, 0.2 Hz, 0.5 Hz, 1.0 Hz, 2.0 Hz, 5.0 Hz, 10 Hz, 20 Hz
Measurement Mode: Tensile Measurement FIG. 6 illustrates the results of the dynamic viscoelasticity test, and FIG. 7 illustrates the master curve at a reference temperature of 25° C. obtained from the dynamic viscoelasticity measurement.

In the conversion film 10 illustrated in FIG. 1, convex portions (the upper protruded island portion 40 and the lower protruded island portion 42) for leading out the upper electrode 24 and the lower electrode 30 are provided, but the present invention is not limited thereto. A configuration in which the convex portions are not formed, and metal foils for leading out electrodes are pasted to the upper electrode 24 and the lower electrode 30 may be adopted.

Furthermore, in the conversion film 10 illustrated in FIG. 1, the upper electrode 24 is smaller than the lower electrode 30, but the present invention is not limited thereto, and the upper electrode 24 and the lower electrode 30 may have the same size (shape). Alternatively, a configuration in which the upper electrode 24 is larger than the lower electrode 30 may be adopted.

Moreover, in the conversion film 10 illustrated in FIG. 1, the lower electrode 30 matches the lower protective layer 32 in portions other than the end edge on the center side, that is, the end edge of the lower electrode 30 is exposed at the end surface of the conversion film 10, but the present invention is not limited thereto, and the lower electrode 30 may have a shape slightly smaller than approximately half of the lower protective layer 32.

Figure 8:
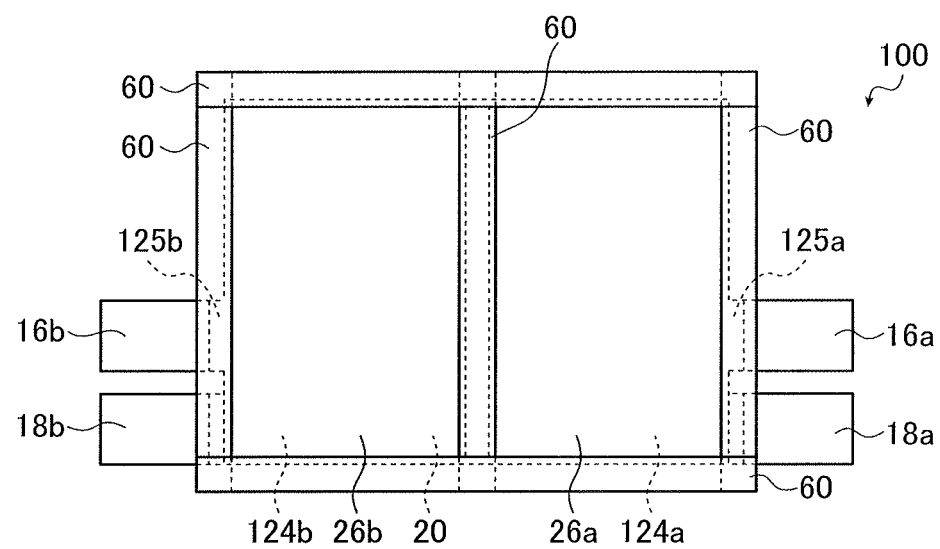
FIG. 8 is a view conceptually illustrating another example of the electroacoustic conversion film of the present invention.

FIG. 8 illustrates another aspect of the conversion film of the present invention.

A conversion film 100 illustrated in FIG. 8 has the same configuration as the conversion film 10 described above, except that the conversion film 100 includes an upper electrode 124 in place of the upper electrode 24, includes a lower electrode 130 in place of the lower electrode 30, and does not include the insulating sheet 14. Accordingly, the same members are denoted with the same reference numerals, and different portions will be mainly described hereinafter.

A configuration of the conversion film 100 will be described by explaining the method of preparing the conversion film 100 illustrated in FIG. 8 with reference to FIGS. 9A to 9C.

Figure 9A:
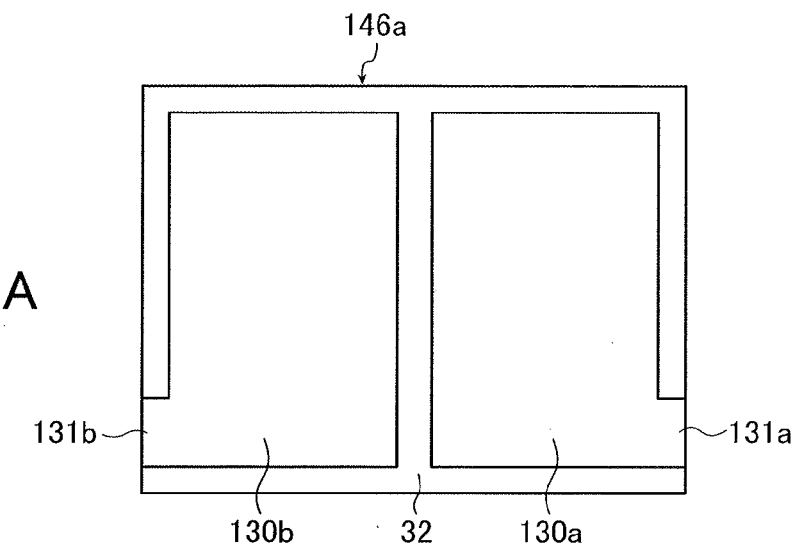
FIGS. 9A to 9C are conceptual views explaining the electroacoustic conversion film illustrated in FIG. 8.

FIG. 9A illustrates the lower electrode 130 and the lower protective layer 32 (sheet-like material 146a) of the conversion film 100. As illustrated in FIG. 9A, the first lower electrode 130a and the second lower electrode 130b of the conversion film 100 have a rectangular shape slightly smaller than approximately half of the lower protective layer 32. In the drawing, the first lower electrode 130a and the second lower electrode 130b are spaced apart at a predetermined distance and arranged on the right side and on the left side, respectively. Further, the first lower electrode 130a and the second lower electrode 130b have convex lower electrode lead-out portions (131a and 131b) that protrude from the rectangular main surfaces of the electrodes to edge sides of the lower protective layer 32, respectively. The lower electrode lead-out portion 131 does not protrude to the outside of the rectangular lower protective layer 32.

Such a sheet-like material 146a is prepared by the same method as the sheet-like material 46a.

Figure 9B:
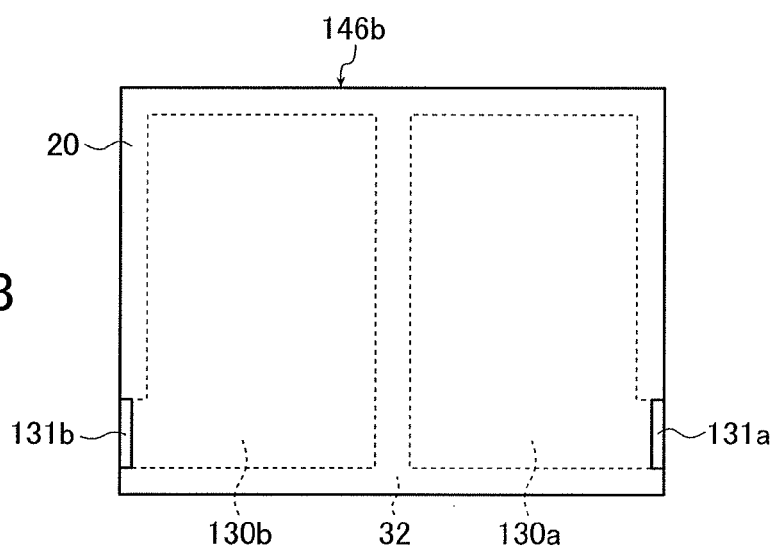

FIG. 9B is a view illustrating a laminate 146b in which the piezoelectric body layer 20 is formed on the sheet-like material 146a. As illustrated in FIG. 9B, the piezoelectric body layer 20 in the regions corresponding to the lower electrode lead-out portions 131 is removed. The laminate 146b is prepared by the same method as the laminate 46b of the conversion film 10.

Figure 9C:
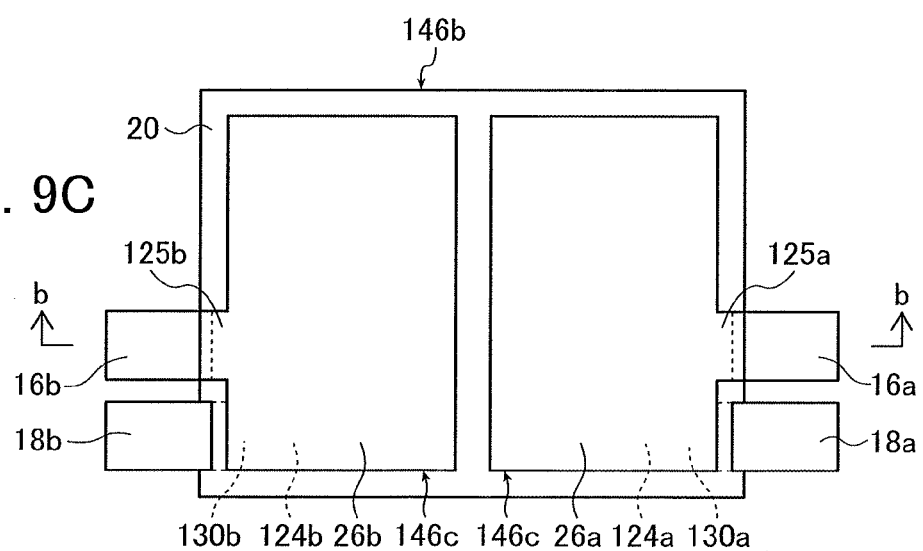

FIG. 9C is a view illustrating a laminate composed of the laminate 146b and a sheet-like material 146c in which an upper electrode 124 is formed on the upper protective layer 26.

The upper electrode 124 has approximately the same shape (size) as the lower electrode 130. An upper electrode lead-out portion 125 (125a and 125b) is formed at a position different from the lower electrode lead-out portion 131 of the lower electrode 130. The upper electrode lead-out portion 125 does not protrude to the outside of the piezoelectric body layer 20.

The sheet-like material 146c is prepared by the same method as the sheet-like material 46c of the conversion film 10 and laminated on the laminate 146b.

Figure 10:
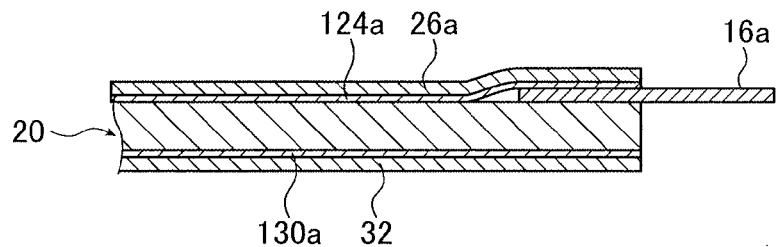
FIG. 10 is a view conceptually illustrating a cross section taken along line b-b in FIG. 9C.

The cross-sectional view taken along line b-b in FIG. 9C is illustrated in FIG. 10.

As illustrated in FIG. 10, the upper metal foil 16 is arranged between the upper electrode lead-out portion 125 and the piezoelectric body layer 20 in a state in which the upper metal foil 16 is interposed therebetween.

As illustrated in FIG. 9C, the lower metal foil 18 is pasted onto the lower electrode lead-out portion 131 from which the piezoelectric body layer 20 has been removed.

In the preparation of the conversion film 100, before the sheet-like material 146c which is a laminate of the upper electrode 124 and the upper protective layer 26 is laminated on the laminate 146b, the upper metal foil 16 may be laminated on the upper electrode 124, and then, lamination and thermocompression bonding of the laminate 146b and the sheet-like material 146c may be performed.

Furthermore, the upper protective layer 26, and the piezoelectric body layer 20 around the upper protective layer 26 are covered by using five strip-like side-surface insulating layers 60, and thereby completing the conversion film 100.

The conversion film 100 illustrated in FIG. 8 has the configuration in which the region where the piezoelectric body layer 20 is exposed is covered with the side-surface insulating layer 60, but the present invention is not limited thereto, and the entire main surface of the piezoelectric body layer 20 including the upper protective layer 26 may be covered.

As described above, the upper protective layer 26 is a thin film, and thus, the strength thereof is insufficient in some cases.

Figure 11:
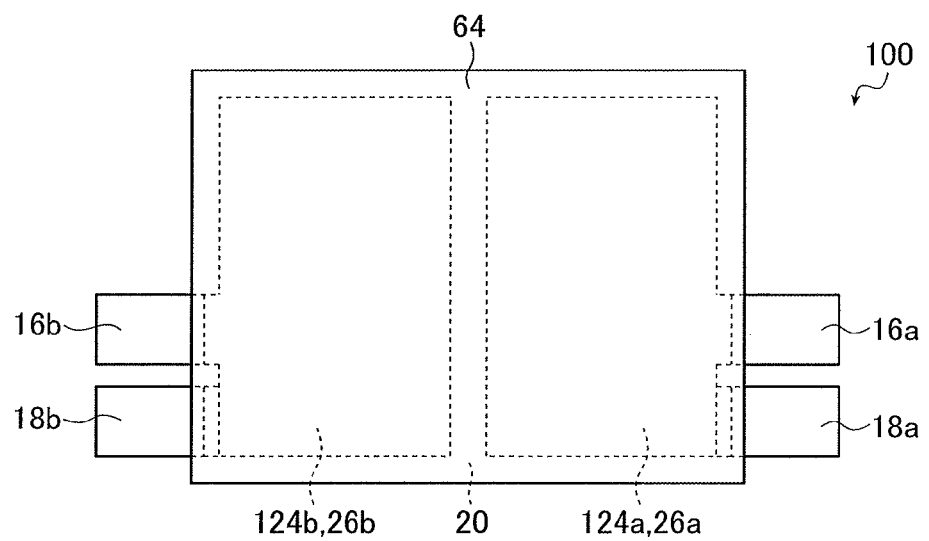
FIG. 11 is a view conceptually illustrating another example of the electroacoustic conversion film of the present invention.

In a case where the strength of the upper protective layer is insufficient, as illustrated in FIG. 11, a second protective layer 64 may be provided so as to cover the entire surfaces of the upper protective layer 26 and the piezoelectric body layer 20, and thereby the strength of the conversion film 10 can be further improved.

As the material forming the second protective layer 64, the materials exemplified in the upper protective layer 26 described above are suitably exemplified. In particular, insulating materials such as PET, PEN, PI, and PP are preferred.

As the attachment method of the second protective layer 64, various known attachment methods of a sheet-like material can be used, according to the material forming the second protective layer 64.

In a case in which the second protective layer 64 is too thick, the second protective layer 64 may adversely affect the flexibility or acoustic characteristics of the conversion film 10. Considering this point, the thickness of the second protective layer 64 is preferably 12 µm to 100 µm, and particularly preferably 12 µm to 40 µm.

Furthermore, if necessary, the conversion film of the present invention may be provided with a second protective layer covering the entire surface of the lower protective layer 32. That is, the conversion film may be interposed between two second protective layers.

Figure 12:
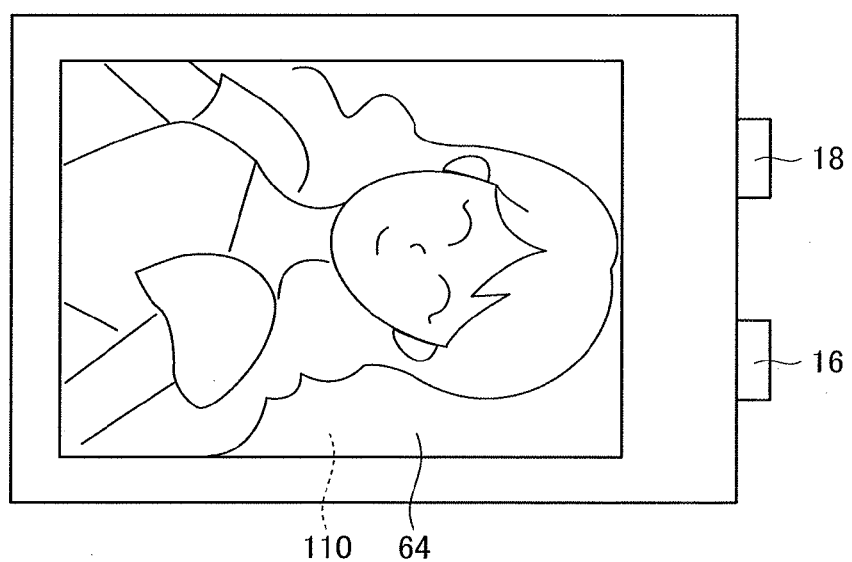
FIG. 12 is a view conceptually illustrating another example of the electroacoustic conversion film of the present invention.

When the second protective layer 64 is provided, an image medium 110 such as a photograph, a thin organic EL display, or the like may be provided between the second protective layer 64 and the upper protective layer 26, as schematically illustrated in FIG. 12.

By adopting the above configuration, the designability and entertainability of the conversion film 100 can be improved. The same may apply to the conversion film 10 illustrated in FIGS. 1 and 2A.

Since the conversion film 100 of the present invention uses the polymeric composite piezoelectric body formed by dispersing the piezoelectric body particles in the viscoelastic matrix formed of the polymer material that exhibits viscoelasticity at normal temperature, the conversion film 10 can suitably reproduces a sound even in a state of being bent. Therefore, the conversion film 100 can be combined with a thin flexible display.

A lower dummy electrode 130c may be arranged in a region (separation region) between the first lower electrode 130a and the second lower electrode 130b of the conversion film 100, and an upper dummy electrode 124c may be arranged in a region (separation region) between the first upper electrode 124a and the second upper electrode 124b.

Figure 13:
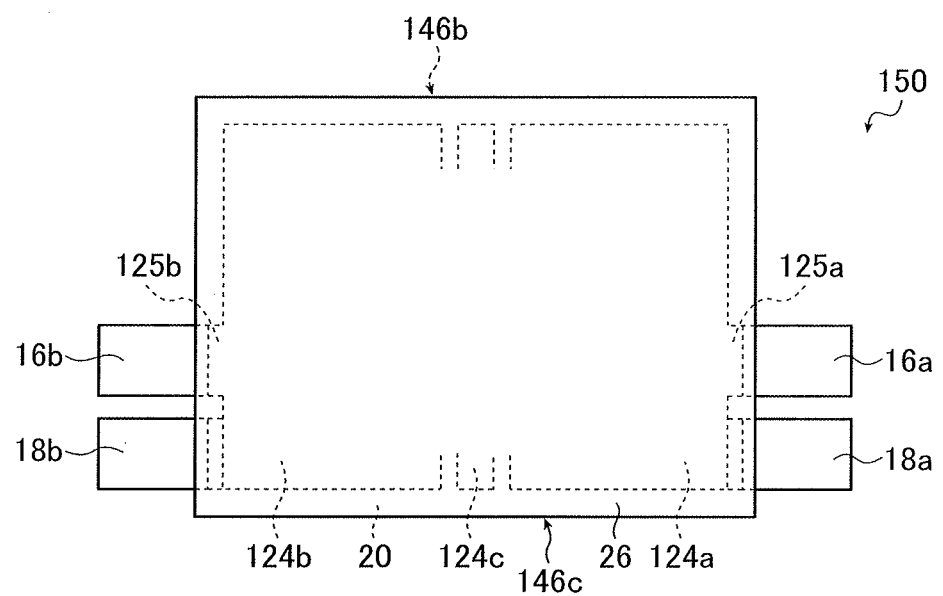
FIG. 13 is a view conceptually illustrating another example of the electroacoustic conversion film of the present invention.
Figure 14A:
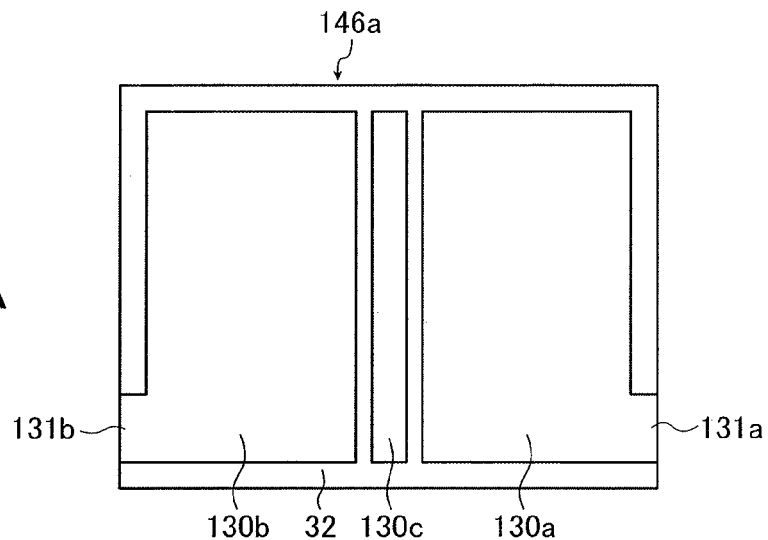
FIGS. 14A to 14C are conceptual views explaining the electroacoustic conversion film illustrated in FIG. 13.
Figure 14B:
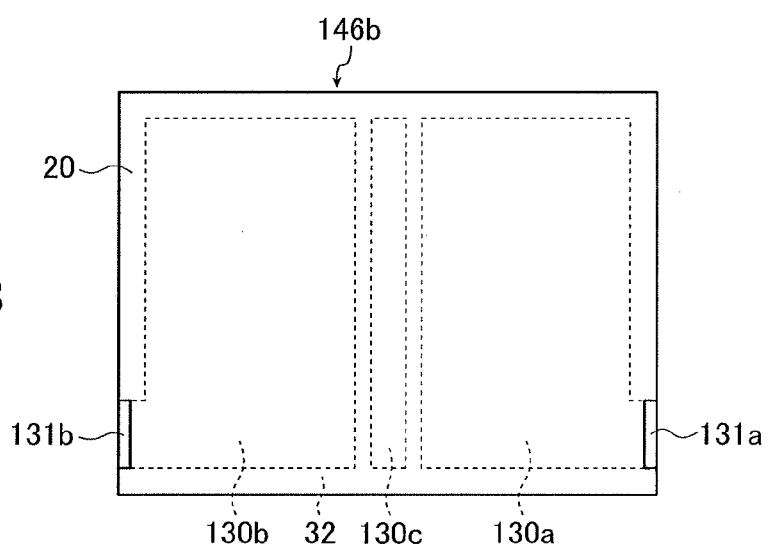
Figure 14C:
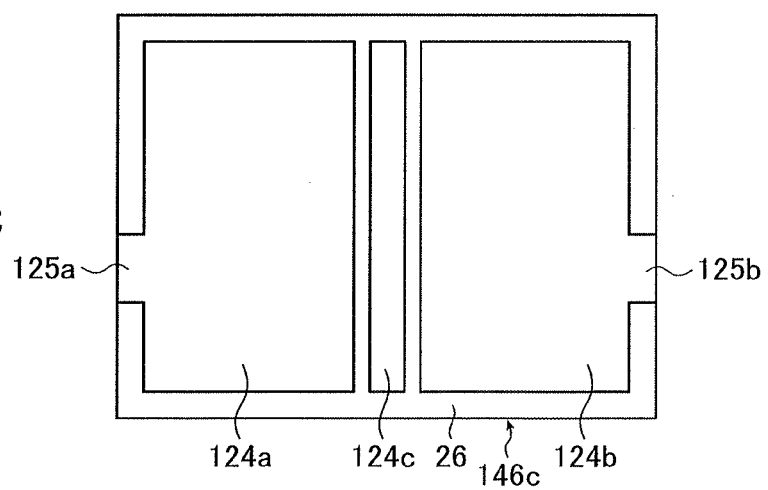

FIG. 13 illustrates a conversion film 150, and FIGS. 14A to 14C illustrate views explaining the conversion film 150 of FIG. 13.

FIG. 14A is a view illustrating the sheet-like material 146a in which the lower dummy electrode 130c is formed in the region between the first lower electrode 130a and the second lower electrode 130b.

In the region between the first lower electrode 130a and the second lower electrode 130b, the lower dummy electrode 130c is formed to be a rectangular shape having the same width in a vertical direction in the drawing as the lower electrode 130. The width in a horizontal direction of the lower dummy electrode 130c is formed such that the lower dummy electrode 130c is spaced apart at a predetermined distance from the first lower electrode 130a and the second lower electrode 130b.

The material constituting the lower dummy electrode 130c may be the same as the first lower electrode 130a and the second lower electrode 130b, and the lower dummy electrode 130c is formed by the same method as the first lower electrode 130a and the second lower electrode 130b.

FIG. 14C is a view of the sheet-like material 146c in which the first upper electrode 124a, the second upper electrode 124b, and the upper dummy electrode 124c are formed on the upper protective layer having the same shape as the main surface of the piezoelectric body layer 20. Here, FIG. 14C is a view when the sheet-like material 146c is viewed from the upper electrode 124 side.

In the region between the first upper electrode 124a and the second upper electrode 124b, the upper dummy electrode 124c is formed in the same shape as the lower dummy electrode 130c. That is, in the region between the first upper electrode 124a and the second upper electrode 124b, the upper dummy electrode 124c is formed in a rectangular shape.

As in the sheet-like material 146a, such a sheet-like material 146c is prepared by forming the thin film electrodes through patterning.

The conversion film 150 is prepared by subjecting the laminate 146b, in which the piezoelectric body layer 20 has been formed on the sheet-like material 146a (FIG. 14B), and the sheet-like material 146c to thermocompression bonding by means of a heating press apparatus, a pair of heating roller, or the like, in a state in which the upper protective layer 26 and the lower protective layer 32 are interposed between the laminate 146b and the sheet-like material 146c.

When the conversion film 150 is driven, no signal (power) is supplied to the upper dummy electrode 124c and the lower dummy electrode 130c.

In the position in which the upper electrode 124 or the lower electrode 130 is not arranged, the piezoelectric body layer 20 and the protective layer (the lower protective layer 32, the upper protective layer 26, the side-surface insulating layer 60, the second protective layer 64, or the like) directly come in contact with each other, and adhesiveness or mechanical strength is likely to be weakened. Therefore, by arranging the dummy electrodes between the first upper electrode 124a and the second upper electrode 124b, and between the first lower electrode 130a and the second lower electrode 130b, it is possible to improve the adhesiveness with the protective layer or the mechanical strength. The same applies to the conversion film 10 illustrated in FIGS. 1 and 2A.

The conversion film 100 illustrated in FIG. 8 has the two active regions (electrode pair), and the first active region (first electrode pair (first upper electrode 124a and first lower electrode 130a)) and the second active region (second electrode pair (second upper electrode 124b and second lower electrode 130b)) have the same size, but the present invention is not limited thereto. The conversion film 100 may have three or more active regions (electrode pairs), and the active regions may be a different size.

Figure 15:
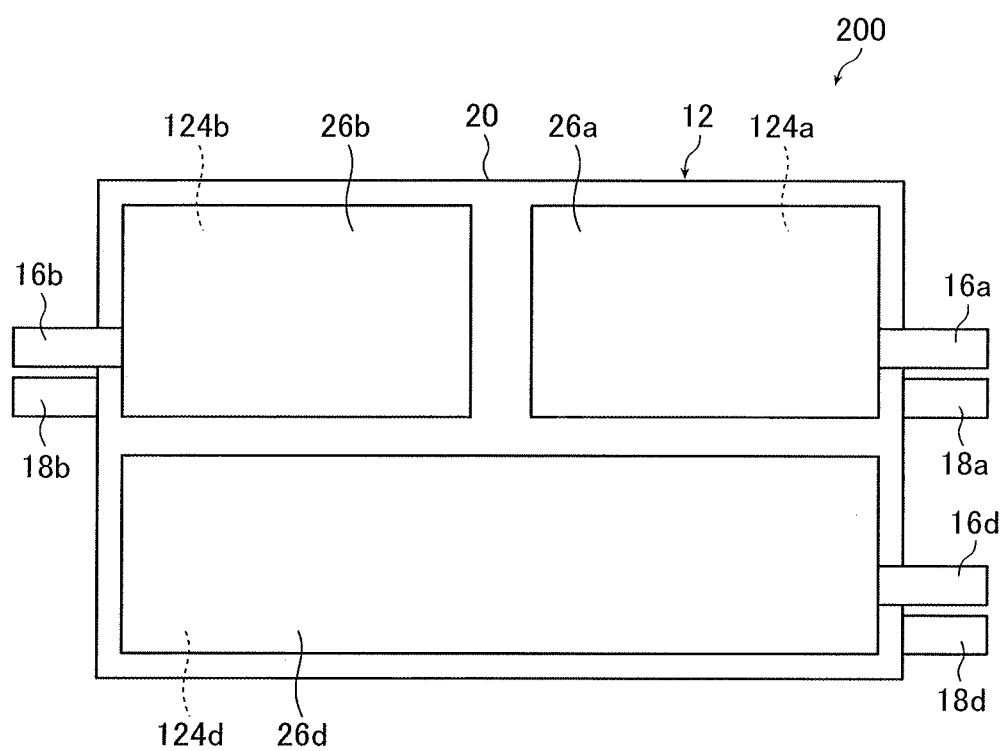
FIG. 15 is a view conceptually illustrating another example of the electroacoustic conversion film of the present invention.

FIG. 15 is a view illustrating an example of another aspect of the electroacoustic conversion film of the present invention.

A conversion film 200 illustrated in FIG. 15 has three active regions. That is, the conversion film 200 has a first electrode pair of a first upper electrode 124a and a first lower electrode 130a (not illustrated), a second electrode pair of a second upper electrode 124b and a second lower electrode 130b (not illustrated), and a third electrode pair of a third upper electrode 124d and a third lower electrode 130d (not illustrated), and the piezoelectric body layer 20 is interposed between each electrode pair. A corresponding upper protective layer 26 is laminated on an upper surface of each upper electrode.

Here, as illustrated in FIG. 15, when a longitudinal direction of the main surface of the conversion film 200 is regarded as a horizontal direction, the first upper electrode 124a (first lower electrode 130a) and the second upper electrode 124b (second lower electrode 130b) are formed on the right and left sides of the upper side of the main surface of the piezoelectric body layer 20 in the drawing, respectively. The first upper electrode 124a and the second upper electrode 124b have the same shapes that are bilaterally symmetrical.

In contrast, the third upper electrode 124d (third lower electrode 130d) is formed on the lower side of the main surface of the piezoelectric body layer 20 in the drawing. As illustrated in the drawing, the third upper electrode 124d is formed to be a rectangular shape of which the width in the horizontal direction approximately matches the width in the horizontal direction of the conversion film 200. The third upper electrode 124d has the width in the horizontal direction that is approximately two times the width of each of the first and second upper electrodes 124a and 124b. That is, the third active region has a vibration surface of a width larger than that of each of the first and second active regions. The third active region has a lower lowest resonance frequency in comparison with the first and second active regions, and thus, it can suitably reproduce an audio signal of a lower frequency. Therefore, for example, by inputting a signal of an R channel to the first electrode pair, inputting a signal of an L channel to the second electrode pair, and inputting a bass signal to the third electrode pair, that is, by constituting a so-called subwoofer system, it is possible to perform satisfactory 2.1 ch reproduction by use of one vibration plate (conversion film).

Furthermore, a plurality of electrode pairs (active regions) may be formed to perform multi-channel reproduction such as 3 ch or 5.1 ch. In this case, the size of respective active regions may be appropriately set depending on frequency bands of the audio signals to be reproduced.

Moreover, two (or three or more) active regions may be formed, and audio signals may be reproduced as virtual surround, in which sound such as multi-channel surround is reproduced, by changing the sound volume, the time, the frequency characteristics, or the like, of the audio signals.

In addition, the conversion film may be used as a parametric speaker in which audible sound having sharp directivity can be reproduced by applying AM modulation, FM modulation, or the like, to ultrasound waves.

In the electroacoustic conversion film of the present invention, even when different signals are input (voltages are applied) to the respective active regions to reproduce audio signals, the audio signals can be suitably reproduced in the respective active regions without causing the vibrations of the respective active regions to interfere with each other. Therefore, by giving a predetermined delay to each of the signals input to the respective active region and controlling each of the audio signals output from the respective active regions so as to simultaneously reach any point in a space, it is possible to give directivity to the output audio signals. Alternatively, by giving a predetermined delay to each of the input signals, it is possible to give a spread to each of the audio signals to be output.

The above configurations will be described with reference to FIGS. 16A to 16C and FIGS. 17A to 17C.

Figure 16A:
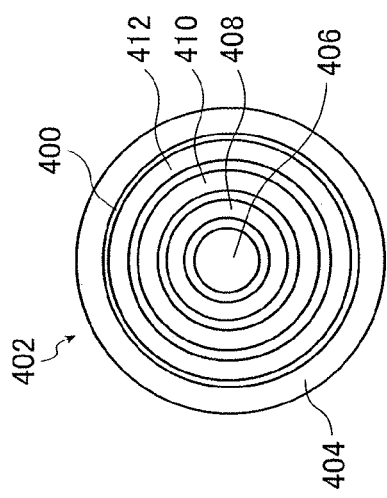
FIG. 16A is a view conceptually illustrating an example of a speaker using another example of the electroacoustic conversion film of the present invention.

FIG. 16A is a view conceptually illustrating an example of a speaker (electroacoustic converter) using another example of the electroacoustic conversion film of the present invention.

A speaker 402 illustrated in FIG. 16A has a circular conversion film 400, and a case 404 that holds the conversion film 400. The case 404 is a cylindrical box-type container having an open surface, and holds the conversion film 400 on the open surface side. Although not illustrated, an elastic support made of a material having elasticity, such as synthetic rubber, or a viscoelastic support made of a material having viscoelasticity, such as glass wool, may be arranged in the case 404 so as to give appropriate tension and curvature to the conversion film 400.

The conversion film 400 has four electrode pairs, that is, four active regions. In FIG. 16A, the upper protective layer is not illustrated, and the upper electrode of each of the electrode pairs is illustrated. The lead-out portion of each of the upper electrodes is not illustrated.

As illustrated in FIG. 16A, four upper electrodes (electrode pairs or active regions) are concentrically formed. That is, the conversion film 400 has a first upper electrode 406 formed in a circular shape and located in a central portion of the conversion film 400, an annular second upper electrode 408 formed to surround the first upper electrode 406, an annular third upper electrode 410 formed to surround the second upper electrode 408 (and the first upper electrode 406), and an annular fourth upper electrode 412 formed to surround the third upper electrode 410 (and the first upper electrode 406 and the second upper electrode 408).

Next, an example of an operation of the speaker 402 when directivity is given to each of the audio signals output from the speaker 402 will be described with reference to FIG. 16B.

In the speaker 402, when directivity is given to each of the audio signals, signals are input to the respective electrode pairs of the conversion film 400 such that a signal having a longer delay is input to an electrode pair located closer to the center side of the conversion film. Specifically, first, a signal is input to the fourth electrode pair having the fourth upper electrode 412 on the outermost circumferential side, next, a signal is input to the third electrode pair having the third upper electrode 410 adjacent to the fourth upper electrode 412, then, a signal is input to the second electrode pair having the second upper electrode 408 adjacent to the third upper electrode 410, and finally, a signal is input to the first electrode pair having the first upper electrode 406 adjacent to the second upper electrode 408.

Figure 16C:
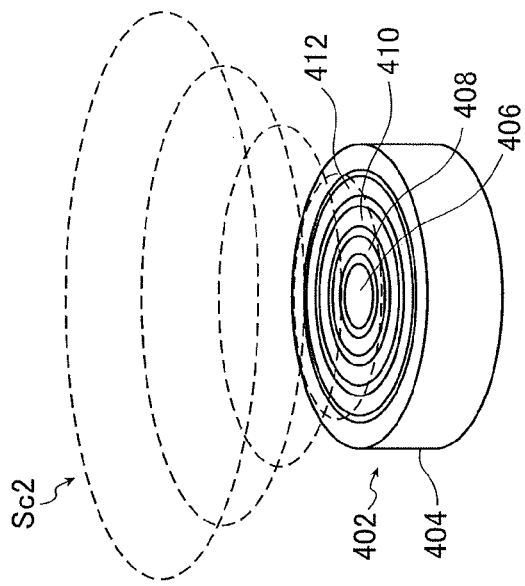
FIG. 16C is a conceptual view explaining another example of the operation of the speaker in FIG. 16A.
Figure 16B:
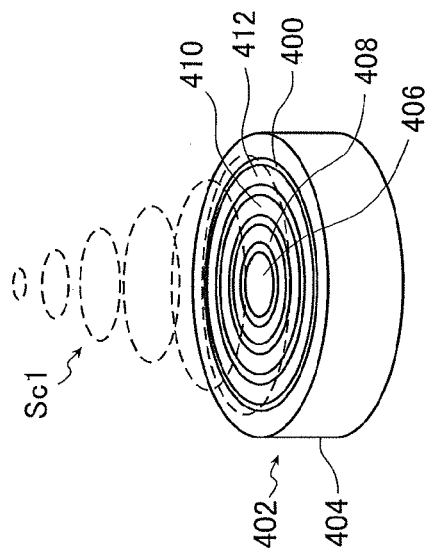
FIG. 16B is a conceptual view explaining an example of an operation of the speaker in FIG. 16A.

As described above, by inputting signals to the respective electrode pairs such that a signal having a longer delay is input to an electrode pair located closer to the center side, it is possible to reproduce the audio signals Sc1 having directivity toward the center side, as schematically illustrated by dotted lines in FIG. 16B.

Next, an example of an operation of the speaker 402 when a spread is given to each of the audio signals output from the speaker 402 will be described with reference to FIG. 16C.

In the speaker 402, when a spread is given to each of the audio signals, signals are input to the respective electrode pairs of the conversion film 400 such that a signal having a longer delay is input to an electrode pair located closer to the circumferential side of the conversion film. Specifically, first, a signal is input to the first electrode pair having the first upper electrode 406 on the most center side, next, a signal is input to the second electrode pair having the second upper electrode 408, then, a signal is input to the third electrode pair having the third upper electrode 410, and finally, a signal is input to the fourth electrode pair having the fourth upper electrode 412.

As described above, by inputting signals to the respective electrode pairs such that a signal having a longer delay is input to an electrode pair located closer to the circumferential side, it is possible to reproduce the audio signals Sc2 that spread outward, as schematically illustrated by dotted lines in FIG. 16C.

The conversion film 400 of the speaker 402 illustrated in FIG. 16A has the configuration in which the respective electrode pairs are concentrically arranged, but the present invention is not limited thereto, and each of the electrode pairs arranged concentrically may further be divided to constitute a plurality of electrode pairs.

FIG. 17A conceptually illustrates an example of a speaker using another example of the electroacoustic conversion film of the present invention. Since a speaker 432 illustrated in FIG. 17A has the same configuration as the speaker 402 illustrated in FIG. 16A, except that the upper electrode of the conversion film 400 is changed, the same portions are denoted with the same reference numerals, and different portions will be mainly described hereinafter.

The speaker 432 illustrated in FIG. 17A has a conversion film 430 and a case 404.

As illustrated in FIG. 17A, each upper electrode of the conversion film 430 has a configuration in which each of the second upper electrode 408, the third upper electrode 410, and the fourth upper electrode 412 of the conversion film 400 illustrated in FIG. 16A is divided into four.

That is, the conversion film 430 has thirteen upper electrodes (electrode pairs or active regions): a first upper electrode 406 located at the center, four upper electrodes 408a to 408d arranged to surround the outer circumference of the first upper electrode 406, four upper electrodes 410a to 410d arranged to annularly surround the four upper electrodes 408a to 408d, and four upper electrodes 412a to 412d arranged to annularly surround the four upper electrodes 410a to 410d.

Next, an example of an operation of the speaker 432 will be described with reference to FIG. 17B.

In the speaker 432, for the respective electrode pairs of the conversion film 430, input signals of the electrode pairs located closer to the center side are delayed longer, and input signals of the electrode pairs (408c, 410c, and 412c) located on the upper left side in the drawing are delayed longer than input signals of the electrode pairs (408a, 410a, and 412a) located on the lower right side in the drawing.

Accordingly, it is possible to reproduce the audio signals Sc3 having directivity toward the upper left direction in the drawing, as schematically illustrated by dotted lines in FIG. 17B.

Alternatively, as schematically illustrated by dotted lines in FIG. 17C, when input signals of the electrode pairs (408b, 410b, and 412b) located on the upper right side in the drawing are delayed longer than input signals of the electrode pairs (408d, 410d, and 412d) located on the lower left side in the drawing, it is possible to reproduce the audio signals Sc4 having directivity toward the upper right direction in FIG. 17C.

The shape of the upper electrode (electrode pair) is a circular or annular shape in the example illustrated in FIGS. 16A and 17A, but the present invention is not limited thereto, and the shape may be a rectangular or rectangular annular shape.

Furthermore, in the example illustrated in FIGS. 16A and 17A, the electrode pairs are concentrically arranged and the signal input to each of the electrode pairs is delayed so as to give directivity to the audio signal to be reproduced, but the present invention is not limited thereto. The electrode pairs may be one-dimensionally arranged in a predetermined direction, and the signal input to each of the electrode pairs may be delayed so as to give directivity to the audio signal to be reproduced.

The reproduction of multi-channel may be combined with the above-described reproduction to which directivity is given.

For example, in the case in which the signals of the R channel and the signals of the L channel are reproduced to perform stereo reproduction, a conversion film having four or more electrode pairs is used; directivity is given to the signals of the R channel using a group of a part of the four or more electrode pairs and the signals having directivity are reproduced; directivity is given to the signals of the L channel using a group of the remaining electrode pairs and the signals having directivity are reproduced; and thereby stereo reproduction to which the directivity is given can be performed.

As in the speaker illustrated in FIGS. 16A to 16C, and FIG. 23, which will be described later, in the configuration in which the viscoelastic support made of a material having viscoelasticity, such as glass wool, is arranged on the back side of the conversion film to give appropriate tension and curvature to the conversion film, it is possible to give directivity to the audio signals to be reproduced according to the curvature thereof.

When the conversion film is supported by the viscoelastic support, although some curvature is formed and thus, some directivity is generated in the audio signals to be reproduced, an ideal plane wave can also be formed in combination with the configuration in which a delay is given to the signal input to each of electrode pairs.

The conversion film 10 illustrated in FIG. 1 has two upper electrodes and two lower electrodes, and each upper electrode and each lower electrode are paired to constitute the electrode pair. As a result, the conversion film 10 has two electrode pairs (active regions), but the present invention is not limited thereto, and the electrodes on one side may be a common electrode.

Figure 18:
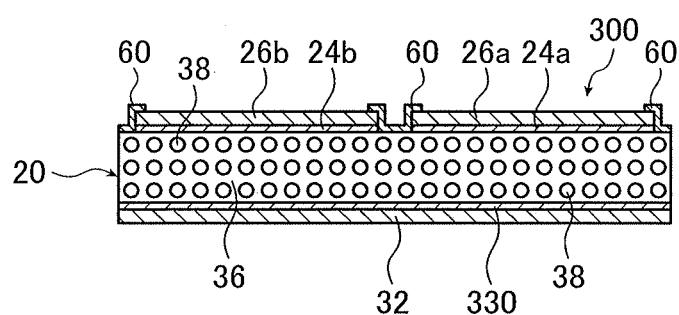
FIG. 18 is a sectional view conceptually illustrating another example of the electroacoustic conversion film of the present invention.

FIG. 18 illustrates a schematic cross-sectional view of another aspect of the conversion film of the present invention.

Since a conversion film 300 illustrated in FIG. 18 has the same configuration as the conversion film 10 except that a common electrode 330 is provided as a lower electrode, the same portions are denoted with the same reference numerals, and different portions will be mainly described hereinafter.

The conversion film 300 illustrated in FIG. 18 includes a piezoelectric body layer 20, two upper electrodes 24a and 24b formed on one surface of the piezoelectric body layer 20, two upper protective layers 26a and 26b formed on the upper electrodes 24a and 24b, a common electrode 330 formed on the other surface of the piezoelectric body layer 20, and a lower protective layer 32 formed on the common electrode 330.

In the illustrated example, the common electrode 330 is formed so as to cover the entire surface of the main surface of the piezoelectric body layer 20. That is, the common electrode 330 is formed so as to cover a region corresponding to a position at which the first upper electrode 24a is formed, and a region corresponding to a position at which the second upper electrode 24b is formed. Accordingly, the common electrode 330 forms an electrode pair together with the first upper electrode 24a, and also forms an electrode pair together with the second upper electrode 24b. Therefore, in the conversion film 300, two electrode pairs are formed.

Even when electrodes of a plurality of electrode pairs are integrated as the common electrode 330 on the one surface in this way, a region (first active region) interposed between the first upper electrode 24a and the common electrode 330, and a region (second active region) interposed between the second upper electrode 24b and the common electrode 330 are driven (vibrated) according to the respective applied voltages. Therefore, it is possible to perform satisfactory stereo reproduction using one vibration plate (electroacoustic conversion film 300) without causing the vibrations of the respective active regions to interfere with each other.

The same material as that of the lower electrode 30 can be used as the material forming the common electrode 330, and also, the same forming method as that of the lower electrode 30 can be used as the forming method of the common electrode 330.

In the conversion film 300 illustrated in FIG. 18, the lower electrodes of the two electrode pairs are used as a common electrode, but the present invention is not limited thereto. The upper electrodes may be constituted as a common electrode and the lower electrodes may be separate electrodes. In a case where the conversion film 300 has three or more electrode pairs, a part of the plurality of upper or lower electrodes may be constituted as a common electrode or all the upper or lower electrodes may be constituted as a common electrode. Further, a part of the plurality of upper electrodes may be constituted as a common electrode, or a part of the plurality of lower electrodes may be constituted as a common electrode.

Next, the configuration of the conversion film 300 will be described by explaining the method of preparing the conversion film 300 illustrated in FIG. 18 with reference to FIGS. 19A to 19C.

Figure 19A:
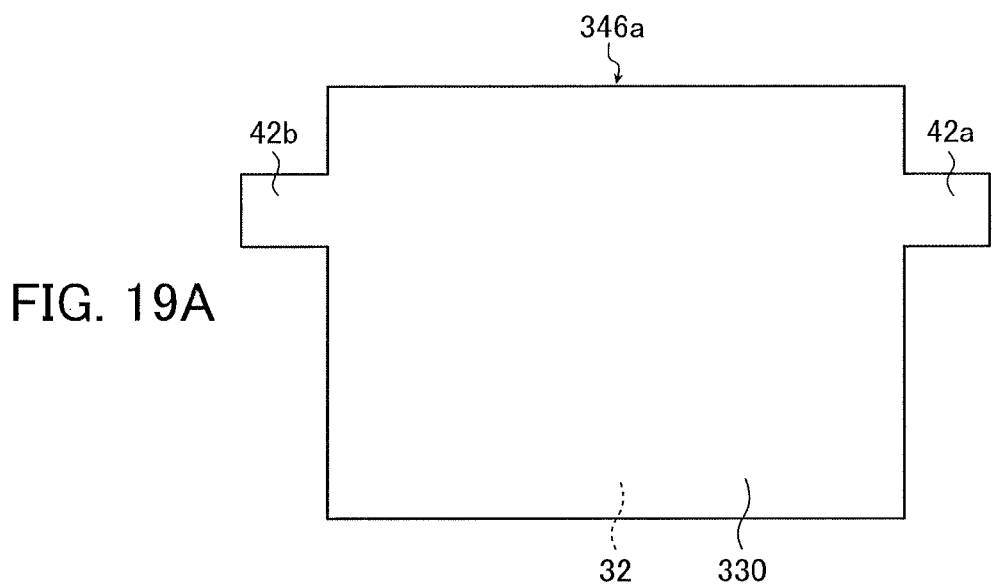
FIGS. 19A to 19C are conceptual views explaining the electroacoustic conversion film illustrated in FIG. 18.

FIG. 19A illustrates the common electrode 330 and the lower protective layer 32 (sheet-like material 346a) of the conversion film 300. As illustrated in FIG. 19A, the common electrode 330 of the conversion film 300 is formed on the entire surface of the lower protective layer 32. Further, convex lower electrode lead-out portions (lower protruded island portions 42a and 42b) are formed such that they respectively protrude in a surface direction from the side surfaces, which face each other, of the main surfaces of the common electrode 330 and the lower protective layer 32.

Although the number of lower protruded island portions 42 in the illustrated example is two, the number of lower protruded island portions may be one when the lower electrode is constituted with a common electrode.

Figure 19B:
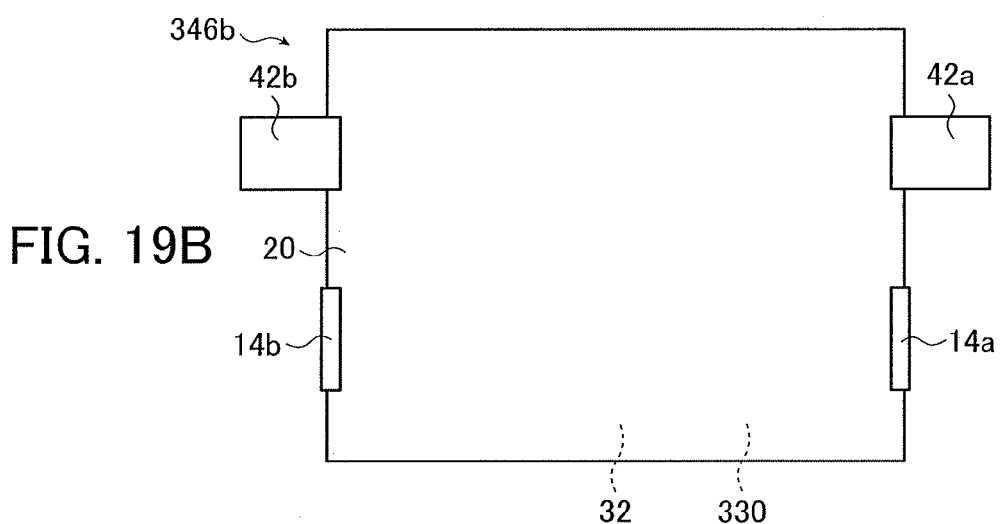

FIG. 19B is a view illustrating a laminate 346b in which the piezoelectric body layer 20 is formed on the sheet-like material 346a. As illustrated in the drawing, the piezoelectric body layer 20 in the region corresponding to the lower protruded island portion 42 is removed. The laminate 346b is prepared by the same method as the laminate 46b of the conversion film 10. The insulating sheet 14 is arranged at the position corresponding to the upper protruded island portion 40.

Figure 19C:
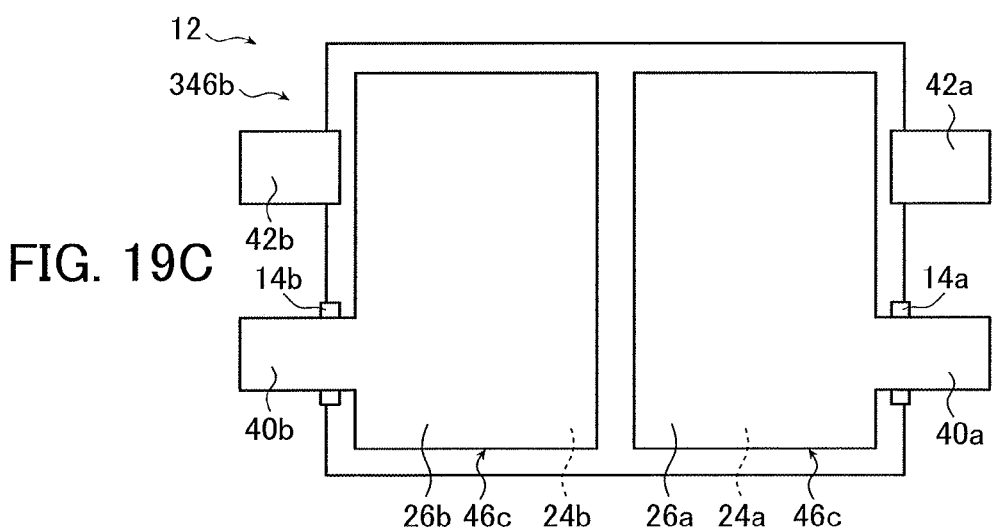

FIG. 19C is a view illustrating a laminate composed of the laminate 346b, and the sheet-like material 46c in which the upper electrode 24 has been formed on the upper protective layer 26.

The sheet-like material 46c is the same as the sheet-like material 46c of the conversion film 10, and the upper electrode lead-out portion (upper protruded island portions 40a and 40b) is formed at a position different from the lower protruded island portion 42 of the common electrode 330.

As in the conversion film 10, the two sheet-like materials 46c are laminated on the laminate 346b in a state in which the upper electrode 24 faces the piezoelectric body layer 20. The sheet-like material 46c to be the first upper electrode 24a and the sheet-like material 46c to be the second upper electrode 24b are spaced apart at a predetermined distance and arranged on the left and right sides, respectively.

Figure 20:
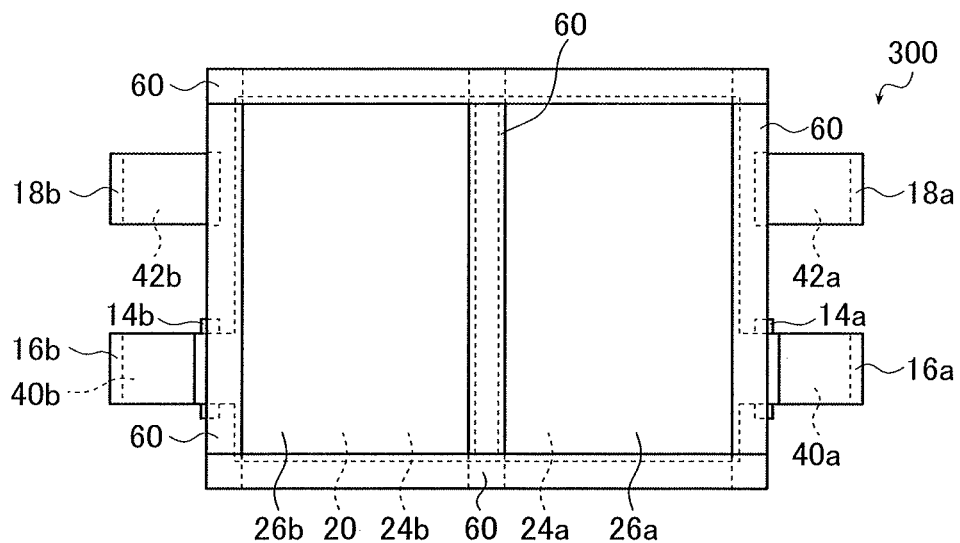
FIG. 20 is a schematic front view of the electroacoustic conversion film illustrated in FIG. 18.

Furthermore, the upper metal foil 16 is laminated on the upper electrode 24 of the upper protruded island portion 40, as illustrated in FIG. 20, and the lower metal foil 18 is laminated on the common electrode 330 of the lower protruded island portion 42.

Moreover, the piezoelectric body layer 20 in the end portions of the upper protective layer 26 (upper electrode 24), and the periphery and the separation region of the upper protective layer 26 is covered with the side-surface insulating layer 60, and thereby completing the conversion film 300 of the present invention illustrated in FIGS. 18 and 20.

Figure 21:
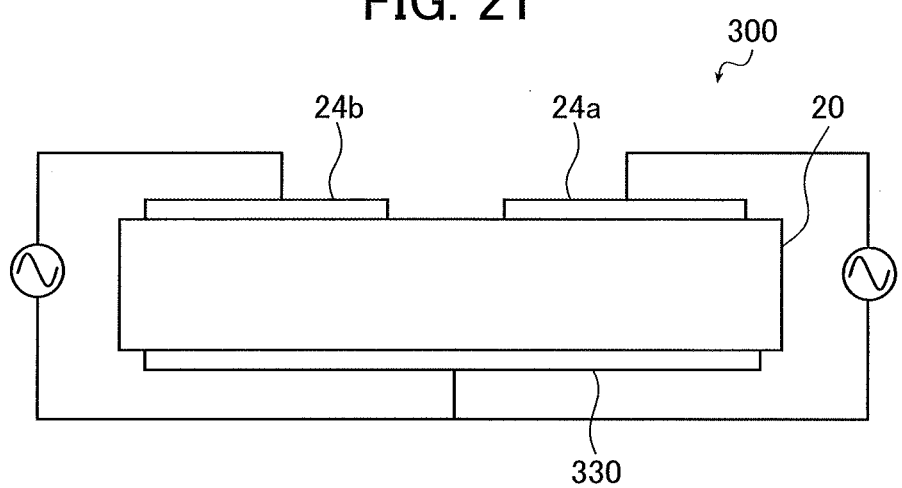
FIG. 21 is a conceptual view explaining the electroacoustic conversion film illustrated in FIG. 18.

FIG. 21 illustrates a conceptual view explaining an operation of the conversion film 300 having the common electrode 330. In FIG. 21, the upper protective layer 26, the lower protective layer 32, the upper protruded island portion 40, the lower protruded island portion 42, and the like are not illustrated.

As illustrated in FIG. 21, when the conversion film 300 is driven, a voltage is applied to the first upper electrode 24a and the common electrode 330 as an electrode pair, and a voltage is applied to the second upper electrode 24b and the common electrode 330 as an electrode pair. Accordingly, the first active region and the second active region are driven (vibrated) according to the respective applied voltage.

As described above, the electroacoustic conversion film of the present invention can be suitably used as a speaker in combination with a flexible display such as an organic EL display. Further, the electroacoustic conversion film of the present invention may be combined with a screen for a projector.

Figure 22:
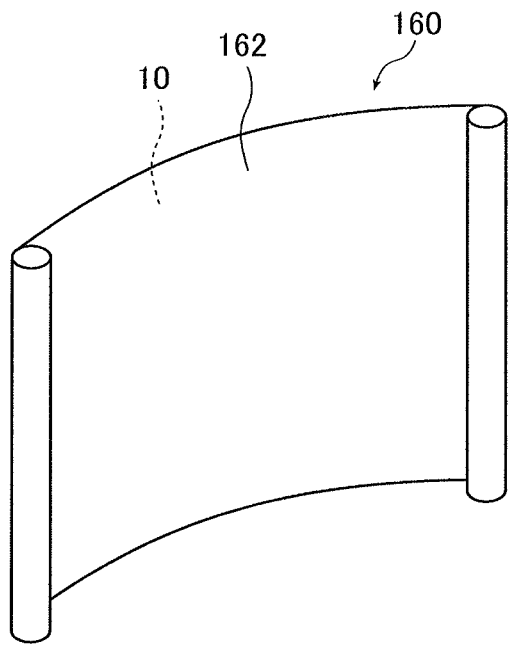
FIG. 22 is a view conceptually illustrating an example of a projector screen using the electroacoustic conversion film of the present invention.

FIG. 22 is a view conceptually illustrating an example of a projector screen using the electroacoustic conversion film of the present invention.

A projector screen 160 illustrated in FIG. 22 includes a screen 162 that displays an image projected by a projector thereon, and the conversion film 10 arranged on a surface opposite to an image display surface of the screen 162.

The screen 162 is, for example, a white or silver sheet-like material formed of resin or the like, and various known screens used as a screen for a projector can be used.

With this configuration, it is possible to improve designability or entertainability of the conversion film. Further, by integrating the conversion film as a speaker and a screen or a flexible display, it is possible to reproduce sound propagating from a direction in which an image is displayed and thus, to improve a sense of presence.

Further, since the projector screen 160 is flexible, the projector screen 160 can have a curvature, as illustrated in FIG. 22. If the image display surface of the screen has a curvature in this way, it is possible to make a distance from a viewer to the screen approximately the same at both of the center of the screen and the end portion thereof, and thus, to improve a sense of presence.

When the image display surface has a curvature as above, the image projected thereon is distorted. Therefore, it is preferable to perform image processing on data of an image to be projected such that the distortion is reduce corresponding to the curvature of the image display surface.

In addition, at least one of the active regions of the conversion film may be used as a microphone.

Further, in a noise cancelling apparatus, at least one of the active regions of the conversion film may be used as a microphone, whereas at least one of the other active regions may be used as a speaker. Such noise cancelling apparatus detects external noise by the microphone using at least one of the active regions and reproduces, from the speaker using at least of the other active regions, sound having a phase opposite to that of the detected noise, thereby cancelling the noise.

Hereinbefore, the electroacoustic conversion film of the present invention has been described in detail, but the present invention is not limited to the above-described examples, and it is needless to say that various improvements or modifications can be made within a scope that does not depart from the gist of the present invention.

EXAMPLES

Hereinafter, the present invention will be described in more detail based on specific examples of the present invention.

Example 1

By the method described above in FIGS. 3A to 3E and FIGS. 4A to 4C, the conversion film 10 of the present invention shown in FIG. 1 was prepared.

First, in the following compositional ratio, cyanoethylated PVA (CR-V manufactured by Shin-Etsu Chemical Co., Ltd.) was dissolved in dimethylformamide (DMF). Thereafter, PZT particles were added to this solution in the following compositional ratio and dispersed by a propeller mixer (rotation frequency of 2,000 rpm), thereby preparing a coating material for forming the piezoelectric body layer 20.

| PZT particles | 300 parts by mass |
|---|---|
| Cyanoethylated PVA | 30 parts by mass |
| DMF | 70 parts by mass |

The PZT particles used were prepared by sintering commercially available PZT raw material powder at 1,000° C. to 1,200° C. and then performing pulverization and classification treatment on the resultant so as to obtain the particles having an average particle size of 5 µm.

Meanwhile, sheet-like materials 46a and 46c were prepared by vacuum-depositing a thin copper film having a thickness of 0.1 µm onto a PET film having a thickness of 4 µm. That is, in this example, the upper electrode 24 and the lower electrode 30 are copper-deposited thin films having a thickness of 0.1 µm, and the upper protective layer 26 and the lower protective layer 32 are PET films having a thickness of 4 µm.

During the process, a PET film with a separator having a thickness of 50 µm (temporary support PET) was used so as to obtain good handleability. After the thin film electrodes and the protective layers were subjected to thermocompression bonding, the separator of each of the protective layers was removed.

The size of the sheet-like material 46a was such a size that the size of the vibration surface at the time of incorporation into a speaker was 210×300 mm (A4 size), and the width of the separation region between the first lower electrode 30a and the second lower electrode 30b was 5 mm.

Further, the size of each of the sheet-like material 46c (upper electrode 24) was 200×142.5 mm. That is, the width of the margin around the upper electrode 24 was 5 mm.

The previously prepared coating material for forming the piezoelectric body layer 20 was coated on the lower electrode 30 (copper-deposited thin film) of the sheet-like material 46a using a slide coater. In this case, the coating material was coated such that the thickness of a coating film after drying became 40 µm.

Then, DMF was evaporated by heating and drying the coating material coated on the sheet-like material 46a on a hot plate at 120° C. As a result, the laminate 46b having a configuration in which the lower electrode 30 made of copper was formed on the lower protective layer 32 formed of PET and the piezoelectric body layer 20 having a thickness of 40 µm was formed on the lower electrode 30 was prepared.

The piezoelectric body layer 20 of the laminate 46b was subjected to polarization processing by means of the aforementioned corona polling illustrated in FIGS. 3C and 3D. In the polarization processing, the temperature of the piezoelectric body layer 20 was controlled to be 100° C., and DC voltage of 6 kV was applied between the lower electrode 30 and the corona electrode 50 to cause corona discharge.

On the laminate 46b having undergone the polarization processing, two sheet-like materials 46c were laminated, in a state in which the upper electrode 24 (thin copper film side) faced the piezoelectric body layer 20. Two sheet-like materials 46c were arranged and laminated, such that they were spaced apart to form a separation region of 5 mm therebetween.

Then, the laminate of the laminate 46b and the sheet-like materials 46c was subjected to thermocompression bonding at 120° C. by using a laminator apparatus, such that the piezoelectric body layer 20 was stuck to the upper electrode 24 and the lower electrode 30, whereby the conversion film 10 was prepared.

Figure 23:
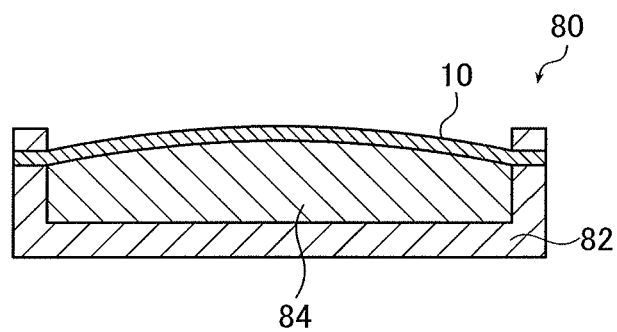
FIG. 23 is a view conceptually illustrating an example of a speaker using the electroacoustic conversion film of the present invention.

As illustrated in FIG. 23, the conversion film 10 prepared as above was incorporated into a case 82 to prepare a speaker 80. As the case 82, a box-type container having one opening was used. This box-type container was a plastic rectangular container having the size of the opening of 200×290 mm and a depth of 9 mm.

A viscoelastic support 84 was arranged within the case 82. The viscoelastic support 84 was a glass wool and had a height of 25 mm and a density of 32 kg/m³ before assembly.

The conversion film 10 was arranged so as to cover the opening of the case 82, the periphery thereof was fixed, and appropriate tension and curvature were given to the conversion film 10 by the viscoelastic support 84.

[Speaker Performance Test]

A signal of an R channel was input to the first electrode pair of the prepared speakers 80 and a signal of an L channel was input to the second electrode pair, that is, a stereo signal was input, and the localization of stereo was evaluated.

The evaluation was performed as sensory evaluation of 20 persons. Evaluation "A" was a case in which the number of persons evaluating the stereo as being localized was 18 or more, evaluation "B" was a case in which the number of persons evaluating the stereo as being localized was equal to or more than 16 and less than 18, and evaluation "C" was a case in which the number of persons evaluating the stereo as being localized was less than 16.

The result of the evaluation was "A".

Comparative Example 1

A commercially available PVDF having a thickness of 50 µm was used as a speaker vibration plate, an upper electrode and a lower electrode were respectively formed on the same positions as in Example 1 by vacuum deposition, and thereby a conversion film was prepared. Both the upper electrode and the lower electrode were copper thin films and had a thickness of 0.1 µm, and copper foil tapes for leading out the electrodes were respectively pasted onto end portions of the upper electrode and the lower electrode.

Incorporation into the speaker was performed as in Example 1, and the localization of stereo was evaluated. The result of the evaluation was "C".

It can be seen from Example 1 that in the electroacoustic conversion film of the present invention, even when two different signals are input thereto, stereo reproduction can be suitably performed without causing the two different signals to interfere (cross-talking) with each other.

In contrast, in Comparative Example 1 in which PVDF is used as the speaker vibration plate, when two different signals are input thereto, the two different signals interfere with each other, and thus, stereo reproduction cannot be performed with high quality.

Example 2

Next, the conversion film 300 illustrated in FIG. 18 was manufactured in Example 2.

In Example 2, the conversion film 300 was prepared in the same manner as in Example 1, except that the size of the vibration surface was 220 mm×330 mm, the size of the first upper electrode 24a was 200 mm×200 mm, the size of the second upper electrode 24b was 200 mm×100 mm, the width of the separation region between the first upper electrode 24a and the second upper electrode 24b was 10 mm, the width of the margin around the upper electrode was 10 mm, and the common electrode 330 covering the entire vibration surface was used in place of the lower electrodes 30a and 30b.

As in Example 1, the conversion film 300 prepared as above was incorporated into the case 82 to prepare a speaker. Using a constant current type power amplifier, a sine wave at 1 kHz was input to the electrode pair (first active region) of the first upper electrode 24a and the common electrode 330, and a sine wave at 1.25 kHz was input to the electrode pair (second active region) of the second upper electrode 24b and the common electrode 330 to measure sound pressure level-frequency characteristics. Here, a measurement microphone was arranged at a position of 50 cm right above the center of the conversion film 300.

Figure 24A:
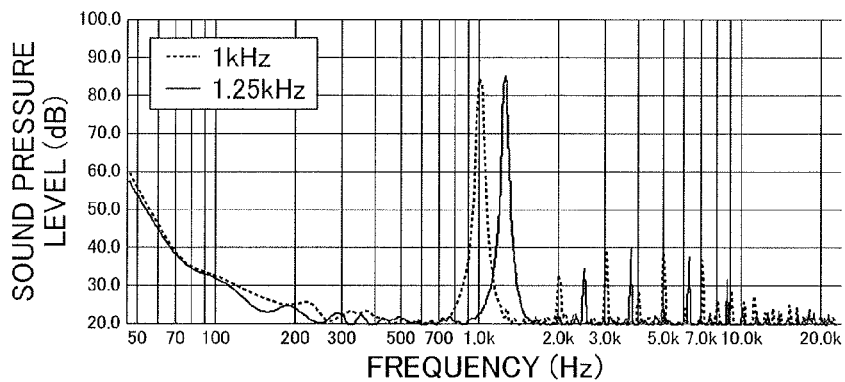
FIGS. 24A to 24D are graphs showing a relationship between a frequency and sound pressure level.
Figure 24B:
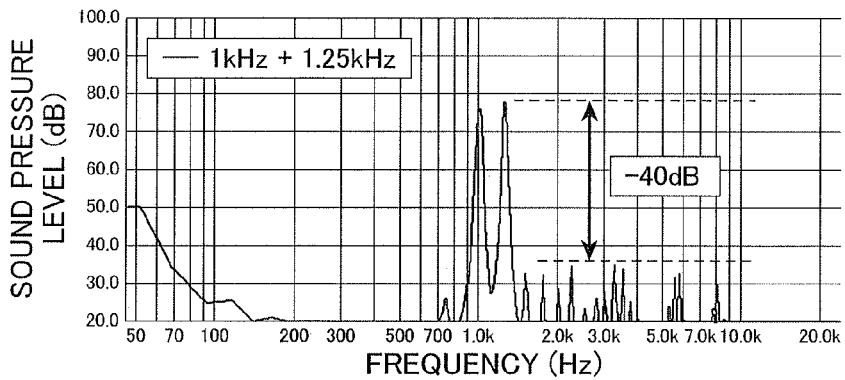
Figure 24C:
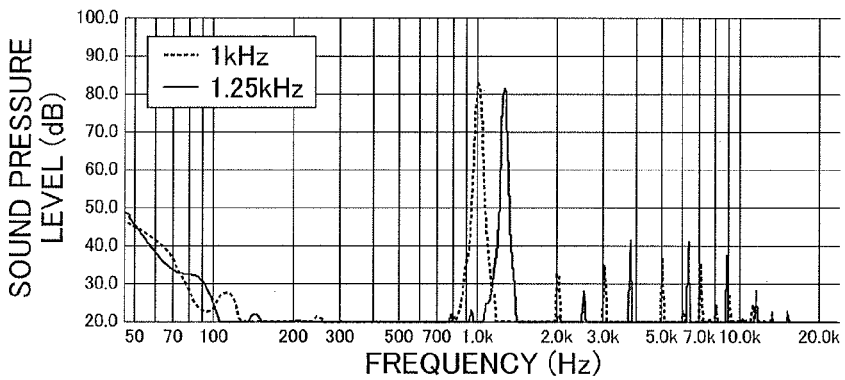
Figure 24D:
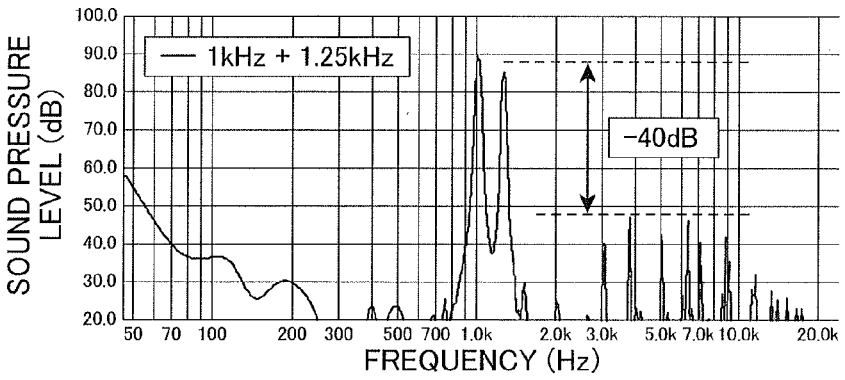

The measurement result of the sound pressure level-frequency characteristics is illustrated in FIG. 24D.

Further, in Example 2, the sound pressure level-frequency characteristics measurement was performed when a sine wave at 1 kHz was only input to the electrode pair (first active region) of the first upper electrode 24a and the common electrode 330 and no voltage was applied to the second active region, and when a sine wave at 1.25 kHz was only input to the electrode pair (second active region) of the second upper electrode 24b and the common electrode and no voltage was applied to the first active region. The measurement result is illustrated in FIG. 24C.

Reference Example 1

A conversion film was prepared in the same manner as in Example 2, except that one upper electrode of 200 mm×300 mm was used and the conversion film had one electrode pair. As in Example 2, the prepared conversion film is incorporated into the case 82 to prepare a speaker. Using the prepared speaker, the sound pressure level-frequency characteristics measurement was performed with respect to a case in which a sine wave at 1 kHz was input to the electrode pair, and a case in which a sine wave at 1.25 kHz was input to the electrode pair. The measurement result is illustrated in FIG. 24A.

In Reference Example 1, the sound pressure level-frequency characteristics measurement was performed when the sine wave at 1 kHz and the sine wave at 1.25 kHz were simultaneously input to the electrode pairs. The measurement result is illustrated in FIG. 24B.

It can be seen from FIGS. 24A and 24B that when signals at different frequencies are simultaneously input to the conversion film having one electrode pair (FIG. 24B), the sound pressure level is higher at frequencies other than harmonics of the input signal and cross-modulation distortion is generated, as compared with the case in which the respective signals are separately input (FIG. 24A).

In contrast, it can be seen from FIGS. 24C and 24D that, in the conversion film of the present invention, a difference is small between when different signals are simultaneously input to the respective electrode pairs (FIG. 24D) and when the signals are separately input (FIG. 24C), and the cross-modulation distortion is small. It can also be seen that even when the electrode on one of the surfaces is the common electrode, the respective electrode pairs (active regions) do not interfere with each other.

Furthermore, it can be seen from FIG. 24B that a sound pressure level of distortion (harmonics) when the conversion film having one electrode pair is used is approximately −40 dB with respect to an input signal (fundamental wave). In contrast, it can be seen from FIG. 24D that a sound pressure level of distortion (harmonics), when the conversion film of the present invention is used, is also approximately −40 dB with respect to the input signal (fundamental wave). Therefore, it can be seen that distortion does not increase even if the common electrode is used.

Example 3

Next, in Example 3, the localization of stereo was evaluated using the conversion film 300 prepared in Example 2. Here, a signal of an R channel was input to the first electrode pair, and a signal of an L channel was input to the second electrode pair, that is, a stereo signal was input.

The conversion film 300 was bent at a curvature radius of 40 cm, and viewing was performed at a position 50 cm away.

The evaluation was performed as sensory evaluation of 20 persons. Evaluation "A" was a case in which the number of persons evaluating the stereo as being localized was 18 or more, evaluation "B" was a case in which the number of persons evaluating the stereo as being localized was equal to or more than 16 and less than 18, and evaluation "C" was a case in which the number of persons evaluating the stereo as being localized was less than 16.

The result of the evaluation was "A".

Comparative Example 2

The localization of stereo was evaluated using the conversion film used in Comparative Example 1, in the same manner as in Example 3. The result of the evaluation was "C".

From the above result, the effects of the present invention are apparent.

What is claimed is:

1. An electroacoustic conversion film, comprising:
   a polymeric composite piezoelectric body in which piezoelectric body particles are dispersed in a viscoelastic matrix formed of a polymer material exhibiting viscoelasticity at normal temperature; and
   two or more electrode pairs,
   wherein one electrode and the other electrode of each of the electrode pairs are arranged on two opposite main surfaces of the polymeric composite piezoelectric body, respectively, to interpose the polymeric composite piezoelectric body therebetween, and thereby each of the electrode pairs forms an active region, wherein the maximum value of the loss tangent (Tan δ) at a frequency of 1 Hz of the electroacoustic conversion film, that is 0.1 or higher and is obtained by dynamic viscoelasticity measurement, is present in a temperature range of 0° C. to 50° C.; and a storage elastic modulus (E') at a frequency of 1 Hz, of the electroacoustic conversion film, that is obtained by the dynamic viscoelasticity measurement, is 10 GPa to 30 GPa at 0° C. and 1 GPa to 10 GPa at 50° C.

2. The electroacoustic conversion film according to claim 1, wherein a plurality of electrodes, which are arranged on one main surface side of the polymeric composite piezoelectric body, of the electrode pairs is a common electrode.

3. The electroacoustic conversion film according to claim 1, wherein all electrodes, which are arranged on one main surface side of the polymeric composite piezoelectric body, of the electrode pairs are a common electrode.

4. The electroacoustic conversion film according to claim 1, wherein two active regions of a first active region and a second active region are formed by two electrode pairs of the two or more electrode pairs, and a signal of an R channel for stereo is input to the first active region, and a signal of an L channel for stereo is input to the second active region.

5. The electroacoustic conversion film according to claim 1, wherein three active regions of a first active region, a second active region and a third active region are formed by three electrode pairs of the two or more electrode pairs, and a signal of an R channel for stereo is input to the first active region, a signal of an L channel for stereo is input to the second active region, and a bass signal is input to the third active region.

6. The electroacoustic conversion film according to claim 5, wherein a longitudinal direction of the third active region matches a longitudinal direction of the polymeric composite piezoelectric body, and a width in the longitudinal direction of the third active region is approximately the same as a width in the longitudinal direction of the polymeric composite piezoelectric body.

7. The electroacoustic conversion film according to claim 1, wherein each interspace between two or more active regions is 1 mm or more.

8. The electroacoustic conversion film according to claim 1, wherein a dummy electrode is arranged on a main surface of the polymeric composite piezoelectric body in the interspace between two or more active regions.

9. The electroacoustic conversion film according to claim 1, wherein a glass transition temperature of the polymer material at a frequency of 1 Hz is 0° C. to 50° C.

10. The electroacoustic conversion film according to claim 1, wherein the maximum value of the loss tangent (Tan δ) at a frequency of 1 Hz of the polymer material, that is 0.5 or higher and is obtained by dynamic viscoelasticity measurement, is present in a temperature range of 0° C. to 50° C.

11. The electroacoustic conversion film according to claim 1, wherein the polymer material is at least one of cyanoethylated polyvinyl alcohol, polyvinyl acetate, polyvinylidene chloride co-acrylonitrile, polystyrene-vinyl polyisoprene block copolymer, polyvinyl methyl ketone, and polybutyl methacrylate.

12. The electroacoustic conversion film according to claim 1, wherein the two or more electrode pairs are concentrically arranged.

13. The electroacoustic conversion film according to claim 12, wherein a signal to which a temporal delay is given according to a position of each of the two or more electrode pairs is input to each of the two or more electrode pairs.

14. An electroacoustic converter, comprising:

the electroacoustic conversion film according to claim 12;

an elastic support arranged in close contact with one main surface of the electroacoustic conversion film; and a holding member that presses the electroacoustic conversion film against the viscoelastic support to hold the electroacoustic conversion film, wherein a signal to which a temporal delay is given according to a position of each of two or more electrode pairs is input to each of the two or more electrode pairs of the electroacoustic conversion film.

15. The electroacoustic converter according to claim 14, wherein the elastic support has viscoelasticity.

16. The electroacoustic conversion film according to claim 12, wherein at least one of active regions formed by the electrode pairs is used as a microphone.

17. A noise cancelling system, comprising:

the electroacoustic conversion film according to claim 16.

18. The electroacoustic conversion film according to claim 1, wherein a signal to which a temporal delay is given according to a position of each of the two or more electrode pairs is input to each of the two or more electrode pairs.

19. An electroacoustic converter, comprising:

the electroacoustic conversion film according to claim 1;

an elastic support arranged in close contact with one main surface of the electroacoustic conversion film; and a holding member that presses the electroacoustic conversion film against the viscoelastic support to hold the electroacoustic conversion film, wherein a signal to which a temporal delay is given according to a position of each of two or more electrode pairs is input to each of the two or more electrode pairs of the electroacoustic conversion film.

20. The electroacoustic converter according to claim 19, wherein the elastic support have viscoelasticity.

21. A flexible display, wherein the electroacoustic conversion film according to claim 1 is attached to a surface at the side opposite to an image display surface of a flexible display having flexibility.

22. A projector screen, comprising:

a screen that displays an image projected by a projector thereon; and the electroacoustic conversion film according to claim 1, wherein the electroacoustic conversion film is attached to a surface at the side opposite to an image display surface of the screen.

23. The electroacoustic conversion film according to claim 1,
wherein at least one of active regions formed by the electrode pairs is used as a microphone.

24. A noise cancelling system, comprising:
the electroacoustic conversion film according to claim 23.

* * * * *